(12) United States Patent
Buckley et al.

(10) Patent No.: US 11,728,819 B2
(45) Date of Patent: Aug. 15, 2023

(54) CONTINUOUS DITHERED WAVEFORM AVERAGING FOR HIGH-FIDELITY DIGITIZATION OF REPETITIVE SIGNALS

(71) Applicant: Lawrence Livermore National Security, LLC, Livermore, CA (US)

(72) Inventors: Brandon Walter Buckley, Walnut Creek, CA (US); Ryan Douglas Muir, Livermore, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 0 days.

(21) Appl. No.: 17/555,270

(22) Filed: Dec. 17, 2021

(65) Prior Publication Data

US 2023/0198540 A1 Jun. 22, 2023

(51) Int. Cl.
*H03M 1/20* (2006.01)
(52) U.S. Cl.
CPC .................................. *H03M 1/201* (2013.01)
(58) Field of Classification Search
CPC ..................................................... H03M 1/201
See application file for complete search history.

(56) References Cited

U.S. PATENT DOCUMENTS

| | | | | |
|---|---|---|---|---|
| 4,757,389 A * | 7/1988 | Clark | ..................... | H04N 1/401 358/406 |
| 5,859,652 A * | 1/1999 | Silverbrook | ............... | B41J 2/04 347/2 |
| 5,909,227 A * | 6/1999 | Silverbrook | ............. | B41J 2/005 347/3 |
| 6,002,710 A * | 12/1999 | Hendrickson | ......... | H04L 7/0054 370/324 |
| 6,331,831 B1 * | 12/2001 | Cvetkovic | ............. | H03M 1/201 341/131 |
| 2008/0315928 A1 * | 12/2008 | Waheed | ............... | H04L 27/0014 341/131 |
| 2009/0002206 A1 * | 1/2009 | Kremin | ................ | H03K 17/962 341/33 |
| 2010/0144295 A1 * | 6/2010 | Kroeger | ................... | H04B 1/18 455/193.1 |

(Continued)

*Primary Examiner* — Lam T Mai
(74) *Attorney, Agent, or Firm* — Perkins Coie LLP

(57) ABSTRACT

Methods and devices for digitizing an analog repetitive signal using waveform averaging are described. An example method includes generating a time-varying dither signal, receiving the analog repetitive signal comprising multiple instances of a waveform, wherein each waveform has a waveform duration, wherein an average of the time-varying dither signal over multiple waveform durations is substantially zero, and wherein the time-varying dither signal varies over each waveform duration, generating a timing alignment, combining each waveform with the corresponding portion of the time-varying dither signal over each waveform duration to produce an analog output signal, converting the analog output signal to a digital output signal, and producing, based on the timing alignment, a digital averaged signal based on averaging the multiple instances of the waveform in the analog output signal, wherein the timing alignment is used to align the multiple instances of the waveform in the analog output signal.

20 Claims, 18 Drawing Sheets

(56) References Cited

U.S. PATENT DOCUMENTS

2014/0368366 A1* 12/2014 Galton .................. H03M 3/386
                                                    341/143
2016/0044753 A1*  2/2016 Lee ....................... H05B 45/20
                                                    315/250

* cited by examiner

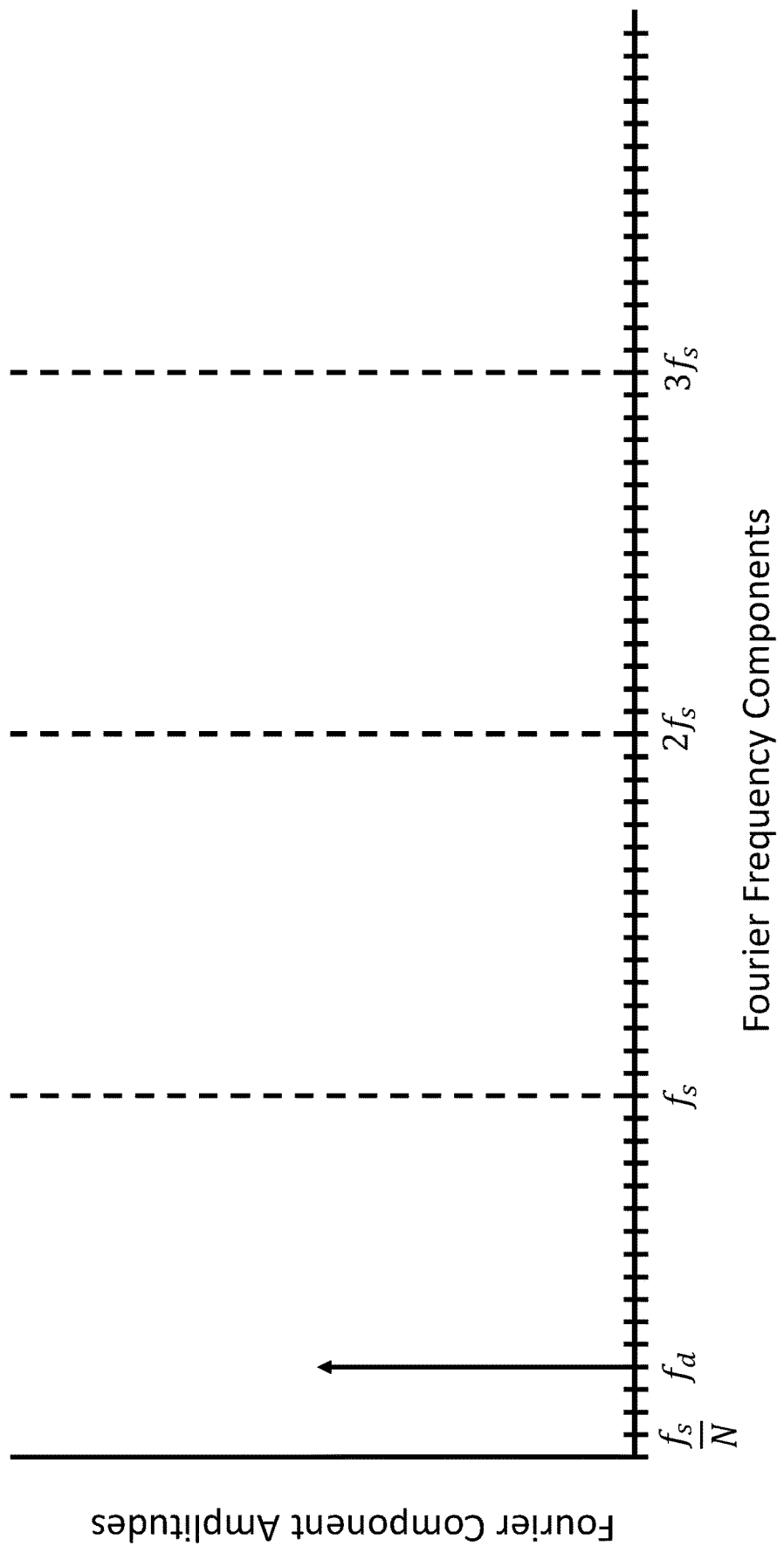

US 11,728,819 B2

CONTINUOUS DITHERED WAVEFORM AVERAGING FOR HIGH-FIDELITY DIGITIZATION OF REPETITIVE SIGNALS

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This document relates to digitization of analog signals and particularly to digitization of analog repeating signals.

BACKGROUND

High fidelity characterization of repetitive waveforms is important for many applications, wherein the goal is to determine, with minimal noise and distortion, the common shape shared across multiple repeating waveforms. However, existing techniques are unable to effectively mitigate the effect of correlated noise and distortion across the repeated waveforms. Thus, there is a need for devices and methods that are able to improve the characterization of repetitive waveforms.

SUMMARY

Embodiments of the disclosed technology relate to continuous dithered waveform averaging. In some example aspects of the technology, a signal under test, consisting of a train of repeating waveforms, is combined with a continuously time-varying dither. The addition of a time-varying dither signal serves to decorrelate certain distortions such as analog-to-digital converter (ADC) differential and integral nonlinearity. Among other features and benefits, the disclosed embodiments reduce the impact of correlated distortions accrued during analog to digital conversion, which results in a higher fidelity measurement of the average waveform of the signal under test. The disclosed embodiments can, for example, be used in many fields including optical pulse shaping, repetitive waveform characterization, and telecommunications.

The disclosed embodiments include systems, devices and methods for digitizing an analog repetitive signal using waveform averaging. In an example aspect, an apparatus for improving digitization of an analog repetitive signal includes a continuous dither source configured to generate a time-varying dither signal, an adder circuit, coupled to the continuous dither source, configured to receive the analog repetitive signal comprising multiple instances of a waveform, wherein each waveform has a waveform duration, receive the time-varying dither signal, wherein an average of the time-varying dither signal over multiple waveform durations is substantially zero, and wherein the time-varying dither signal varies over each waveform duration, and combine each waveform with a corresponding portion of the time-varying dither signal over each waveform duration, a timing detector configured to generate a timing alignment, an analog to digital converter (ADC), coupled to the adder circuit, configured to receive an analog output signal from the adder circuit and convert the analog output signal to a digital output signal, and a synchronized averaging circuit, coupled to the analog to digital converter and the timing detector, configured to receive the digital output signal and the timing alignment, and to produce a digital averaged signal.

In another example aspect, method for improving digitization of an analog repetitive signal includes generating a time-varying dither signal, receiving the analog repetitive signal comprising multiple instances of a waveform, wherein each waveform has a waveform duration, wherein an average of the time-varying dither signal over multiple waveform durations is substantially zero, and wherein the time-varying dither signal varies over each waveform duration, generating a timing alignment, combining each waveform with the corresponding portion of the time-varying dither signal over each waveform duration to produce an analog output signal, converting the analog output signal to a digital output signal, and producing, based on the timing alignment, a digital averaged signal based on averaging the multiple instances of the waveform in the analog output signal, wherein the timing alignment is used to align the multiple instances of the waveform in the analog output signal.

In yet another example aspect, an apparatus for improving digitization of an analog repetitive signal includes means for generating a time-varying dither signal, means for summing two signals configured to receive the analog repetitive signal comprising multiple instances of a waveform, wherein each waveform has a waveform duration, receive the time-varying dither signal, wherein an average of the time-varying dither signal over multiple waveform durations is substantially zero, and wherein the time-varying dither signal varies over each waveform duration, and combine each waveform of the analog repetitive signal with a corresponding portion of the time-varying dither signal over the waveform duration, means for generating a timing alignment, means for converting an analog signal to a digital signal configured to receive an analog output signal from the means for summing and convert the analog output signal to a digital output signal, and means for averaging configured to receive the digital output signal and the timing alignment, and to produce a digital averaged signal.

BRIEF DESCRIPTION OF THE DRAWINGS

FIG. 6B illustrates an example Fourier decomposition of the sinusoidal dither.

DETAILED DESCRIPTION

Figure 1:
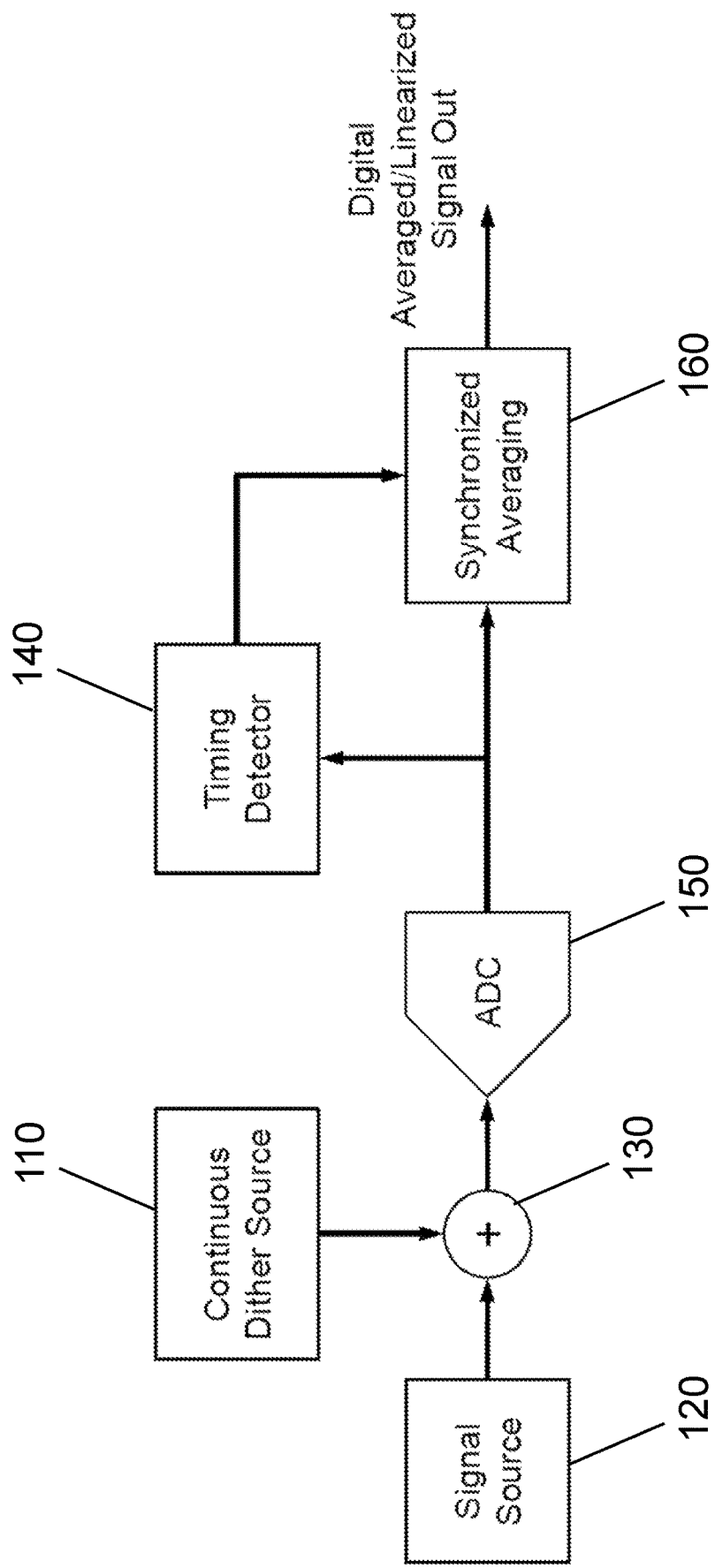
FIG. 1 is a block diagram illustrating an example system for the improved digitization of an analog repetitive signal.

The ability to characterize repetitive waveforms, which are often used in optical pulse shaping and telecommunications, with high fidelity is becoming increasingly important. The goal is to determine, with minimal noise and distortion, the waveform shape that is commonly shared across multiple repeating waveforms. Digital waveform averaging is a known technique to reduce uncorrelated noise present in the measured signal. Uncorrelated error is that which is not common across different waveforms. In conventional digital waveform averaging, multiple digitized waveforms are temporally aligned, and at each sample point the corresponding values from each waveform are averaged. In so doing, the root mean square deviation of uncorrelated noise is reduced by a factor equal to the square root of the number of averaged waveforms. Meanwhile, the value common to each repeated waveform persists with averaging. The result is a higher signal-to-noise ratio (SNR) measurement of the waveform under test.

While waveform averaging is effective at mitigating uncorrelated noise, it is unable to differentiate the signal under test from correlated noise and distortion. Correlated noise and distortion are errors which are common across all waveforms. An important source of such distortion is due to non-linearity in the ADC transfer function. An ADC works by dividing the full-scale range into a non-overlapping set of contiguous bins, such that every input level lies in a unique bin. The ADC transfer function assigns a unique digital code to each bin. Ideally, the bin widths are uniform, with an ideal bin width, termed a least significant bit (LSB), equal to the full-scale range divided by the number of bins. However, in practice, imperfections arise, leading to non-uniformities in the bin width and thus a non-linear transfer function. The deviation in width of each bin from the ideal is termed differential nonlinearity (DNL), and the accumulated deviation is termed integral non-linearity (INL). Typical DNL values are a fraction of a LSB and the total accumulated INL can be on the order of several LSBs. Although this error may be small relative to the total number of ADC bins, it can still have a big impact, especially when attempting to measure small features with a high relative fidelity. DNL/INL errors are typically static and do not change across different instances of the repetitive signal. Therefore, waveform averaging alone cannot be used to improve this source of distortion.

One method to decorrelate the errors from DNL/INL is to take advantage of the fact that the magnitude and sign of the error changes depending on the bins in which the signal is digitized. By applying a time-varying offset to the incoming signal under test, corresponding points on different waveforms will no longer land in the same ADC bin. The error from DNL/INL is therefore no longer common across waveforms and can be reduced with waveform averaging. Provided that these intentional time-varying dithering offsets can be removed by post-processing, the original waveform can therefore be recovered with higher fidelity. Applying a time-varying offset in this way, typically termed dithering, is a known technique for improving the linearity of ADCs. However, it comes with a variety of engineering performance tradeoffs. Adding dither to a signal under test results in reduced SNR. Herein, the dither can act as a noise source in the case of a non-deterministic dither, and the signal amplitude must also be reduced to leave overhead and avoid clipping the ADC. When the dither is deterministic, it can instead act as a source of distortion unless compensated for. Multiple techniques exist to remove the dither from the measured waveforms in post processing, including subtraction and filtering, but all come with drawbacks, added complexity, and potentially residual errors. Furthermore, when using a sequence of constant voltage offsets as a dither, there is typically a settling time period between offsets. Waveform averaging must precisely synchronize with the dither source so as not to include signal waveforms overlapping with this settling time. Such a configuration adds complexity to the system and increases the total averaging time for the same number of total averaged waveforms.

Embodiments of the disclosed technology utilize continuous dithering with waveform averaging in specific ways that result in new strategies for mitigating the performance tradeoffs of dithering that have not been previously considered in conventional techniques. In an example, the time-varying deterministic dither signals can be selected to leave no residual error after averaging, thereby improving fidelity and reducing complexity. Also, the SNR reduction from the added overhead requirement does not necessarily lead to lower system performance since it can be mitigated with further averaging. A continuously varying dither contains no periods of settling time, so all signal waveforms can be included in the final averaged result, reducing averaging time. Finally, the relative phase of the signal and dither is no longer important with a continuous dither, reducing system complexity. The overall synergistic combination of continuous dithering and waveform averaging results in improved fidelity, lower complexity, and reduced averaging time.

FIG. 1 is a block diagram illustrating an example system for the improved digitization of an analog repetitive signal. As shown therein, the system includes a continuous dither source (or "dither source" for simplicity) 110, a signal source 120, an adder circuit (or summation block) 130, a timing detector 140, an analog-to-digital converter (ADC) 150, and a synchronized averaging circuit 160.

The signal source 120 is configured to generate a signal under test (or "analog input signal"), which includes a repeating sequence of waveforms, and the continuous dither source 110 is configured to generate continuously varying signal. The repeating sequence of waveforms and the continuously varying waveform are combined using the adder circuit 130. In an example, the continuously varying waveform is an analog continuous time-varying dither signal (e.g., a time-varying dither voltage signal), and the adder circuit shifts portions of the waveform in the DC domain by the value of the time-varying dither signal corresponding to the portion of the waveform.

In some embodiments, the timing detector 140 determines the starting point of each waveform in the repeating sequence of waveforms, and that information is used to temporally align the waveforms prior to averaging. The ADC 150 digitizes the summation of the analog input signal and the dither so that it can be digitally processed and/or stored. The synchronized averaging circuit 160 is configured to perform an averaging operation on a certain number of measured waveforms. The averaging operation uses the starting times from the timing detector 140, and temporally aligns each digitized waveform plus dither and then averages all the measured values at each sample point. The continuous varying dither is selected such that it averages to exactly or nearly zero after waveform averaging at the signal repetition rate.

In some embodiments, some or all of the circuit components can be implemented using hardware devices, e.g., a field programmable gate array (FPGA) or an application specific integrated circuit (ASIC). In some embodiments, at least some of the components or associated operations can be implemented using a processor (e.g., a microprocessor, a controller, etc.) that can be configured to perform the disclosed operations upon execution of a program code or instructions that are stored and retrieved from a memory.

In some embodiments, the adder circuit 130 can be implemented using a summing operational amplifier circuit. In other embodiments, the adder circuit includes a differential amplifier. In this latter example, the signal under test can be applied to the positive input of the differential amplifier, while the dither can be applied to the negative input.

In some embodiments, the timing detector 140 can be implemented using an energy detection circuit, which is configured to determine a start time of the waveform based on the energy in the waveform exceeding a predetermined threshold. In other embodiments, an external trigger signal can be coupled to the timing detector.

In some embodiments, the ADC 150 can be implemented using a sample-and-hold circuit, which receives an analog input signal and holds a particular value of the analog input signal for a predefined duration. The output of the sample-and-hold circuit is quantized and encoded to generate a digital (or digitized) signal that is representative of the analog input signal, and depends on the resolution of the quantizer used. A higher number of bits used in the quantizer corresponds to a more accurate representation of the analog input signal. In some examples, the ADC can be implemented as a flash (or parallel) ADC, a dual slope ADC, or a successive approximation ADC.

In some embodiments, the synchronized averaging circuit 160 implements an averaging operation on a predefined number of digitized waveforms. In other embodiments, a weighted average can be implemented by the synchronized averaging circuit. In an example, the weights of the weighted average may be based on the level of noise or an associated metric, e.g., the signal-to-noise ratio (SNR). In other example, the weights may be exponential weights that include higher weights for more recent instances of the waveform, e.g., a forgetting factor.

In the example illustrated in FIG. 1, the signal under test s(t) is a repetitive function of time with a repetition rate $f_s=1/T_s$, where $T_s$ is the period of each repeated waveform such that $s(t+nT_s)=s(t)$ for all integers n. The noise, which is added to the analog repetitive signal using the adder circuit 130, is modeled as a stochastic variable $\mathcal{N}_s(t)$ with mean ($\mathcal{N}_s(t)$)=0 and variance var[$\mathcal{N}_s(t)$]=$\sigma_s^2$. If the noise bandwidth is sufficiently larger than the repetition rate of the analog repetitive signal, then $\mathcal{N}_s(t)$ and $\mathcal{N}_s(t+nT_s)$ will be uncorrelated for all integers n. In this framework, waveform averaging of the noisy signal $s(t)+\mathcal{N}_s(t)$ results in the following expression (denoted Eq. (1)):

$$\overline{s}_N(t) \equiv \frac{1}{N}\sum_{n=0}^{N-1}[s(t+nT_s)+\mathcal{N}_s(t+nT_s)] = s(t) + \frac{1}{N}\sum_{n=0}^{N-1}\mathcal{N}_s(t+nT_s)$$

Herein, N is the number of averaged waveforms and $\overline{s}_N(t)$ is the averaged waveform of the signal under test. In Eq. (1), time is considered to be within one signal waveform period, i.e., $t \in [0, T_s)$. The last term on the right in Eq. (1) is the average of uncorrelated random variables, such that the variance is reduced by a factor of 1/N. The result is a waveform averaged signal with mean $(\overline{s}_N(t))=s(t)$ and standard deviation $\sigma_{s_N}=\sigma_s/\sqrt{N}$. As more waveforms are averaged, i.e., N increases, the noise decreases, and the waveform averaged result more accurately matches the desired signal under test.

FIGS. 2-5, 6A, 7, 8A and 9 are block diagrams illustrating other example systems for the improved digitization of an analog repetitive signal. These examples include features and/or components that are similar to those shown in FIG. 1, with the addition of a synchronized trigger in different configurations, as described herein. At least some of these features and/or components may not be separately described in these examples.

Figure 2:
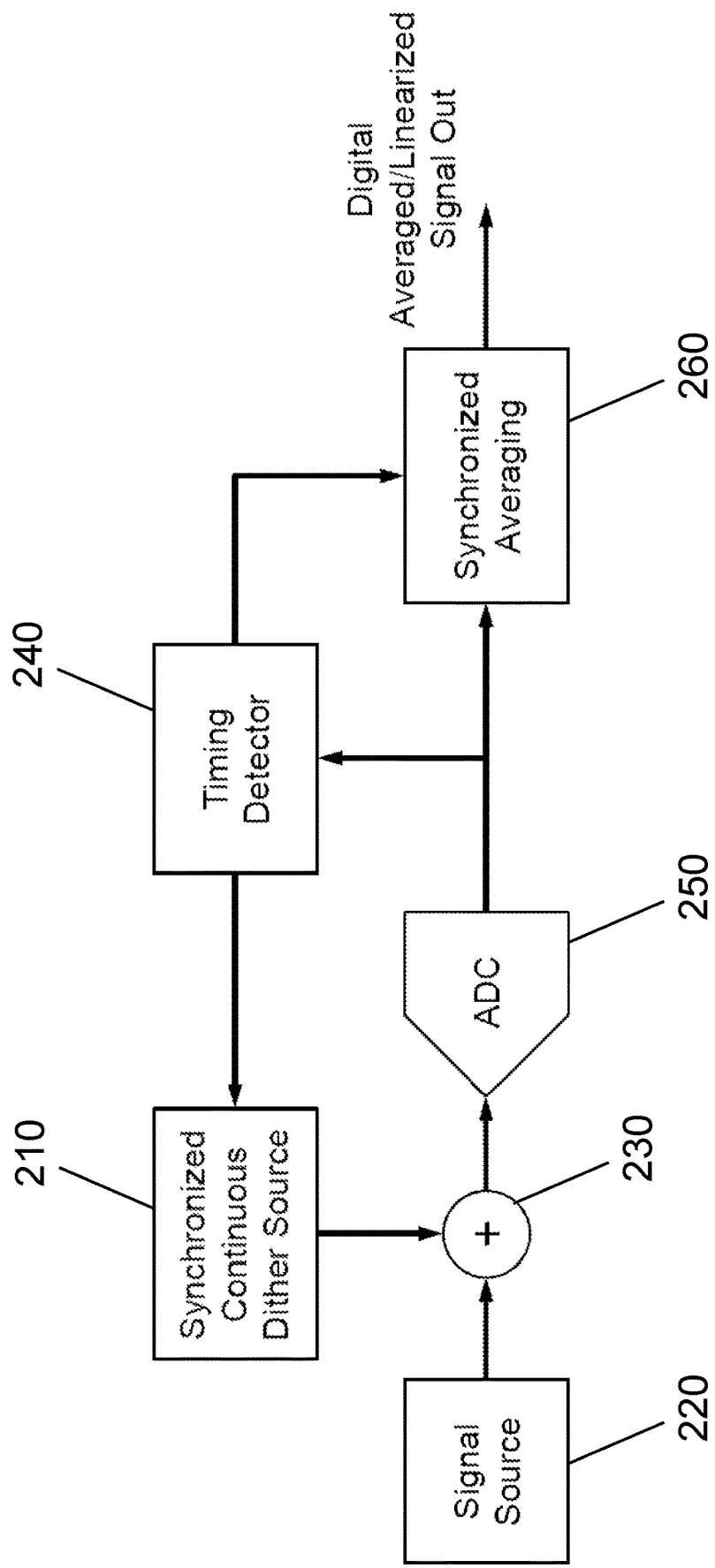
FIG. 2 is a block diagram illustrating another example system for the improved digitization of an analog repetitive signal.

In some embodiments, and as shown in FIG. 2, the continuous dither source 210 receives timing information from the timing detector 240, which enables the dither signal to be aligned with the waveforms in the signal under test (generated by the signal source 220).

Figure 3:
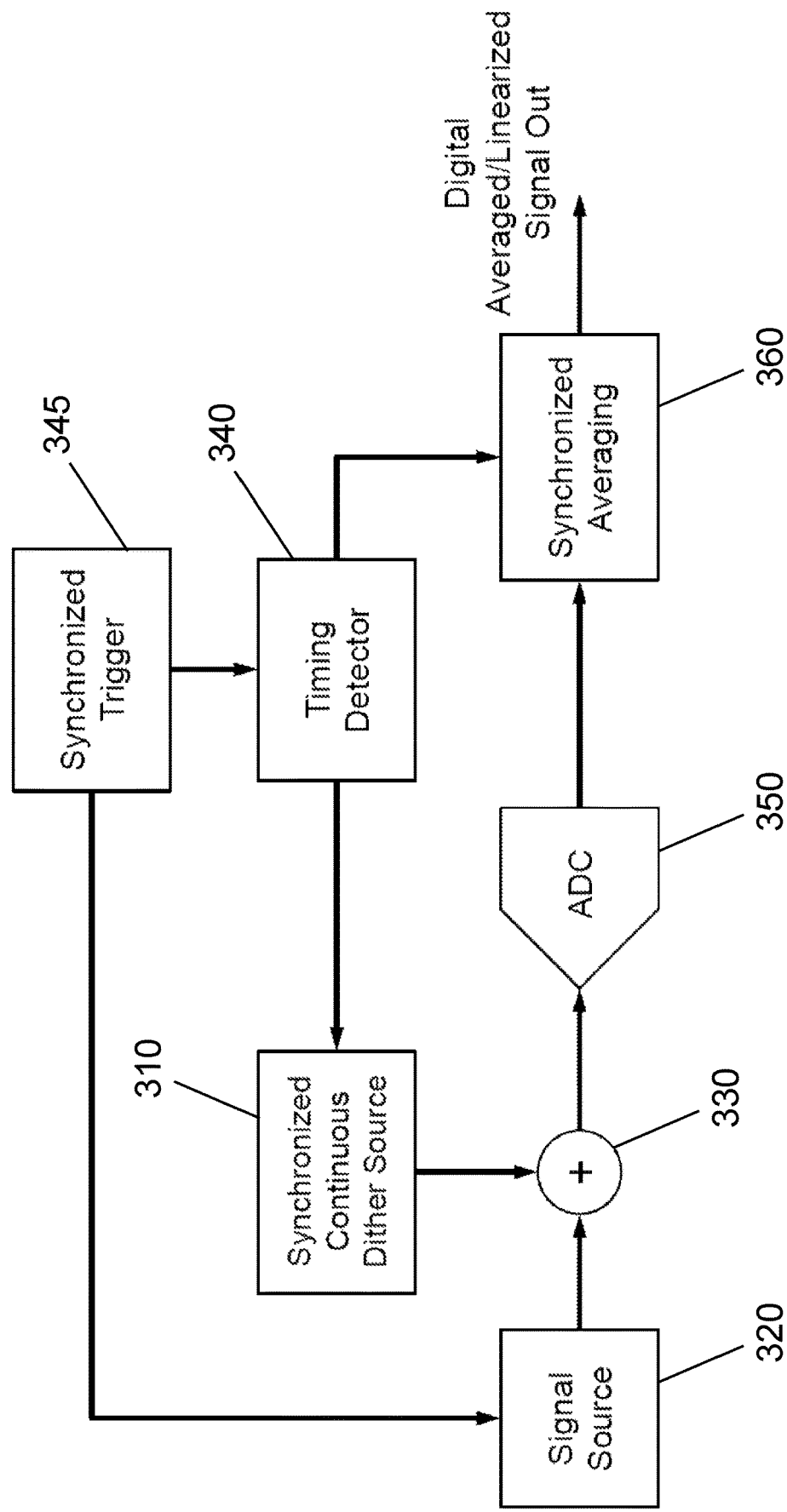
FIG. 3 is a block diagram illustrating yet another example system, which includes a synchronized trigger, for the improved digitization of an analog repetitive signal.

In some embodiments, and as shown in FIG. 3, the system further includes a synchronized trigger 345, which acts as a source for a trigger signal that is synchronized with the repeating waveform. An output of the synchronized trigger 345 is input to both the timing detector 340 and the signal source 320, which enables the alignment operations previously described.

Figure 4:
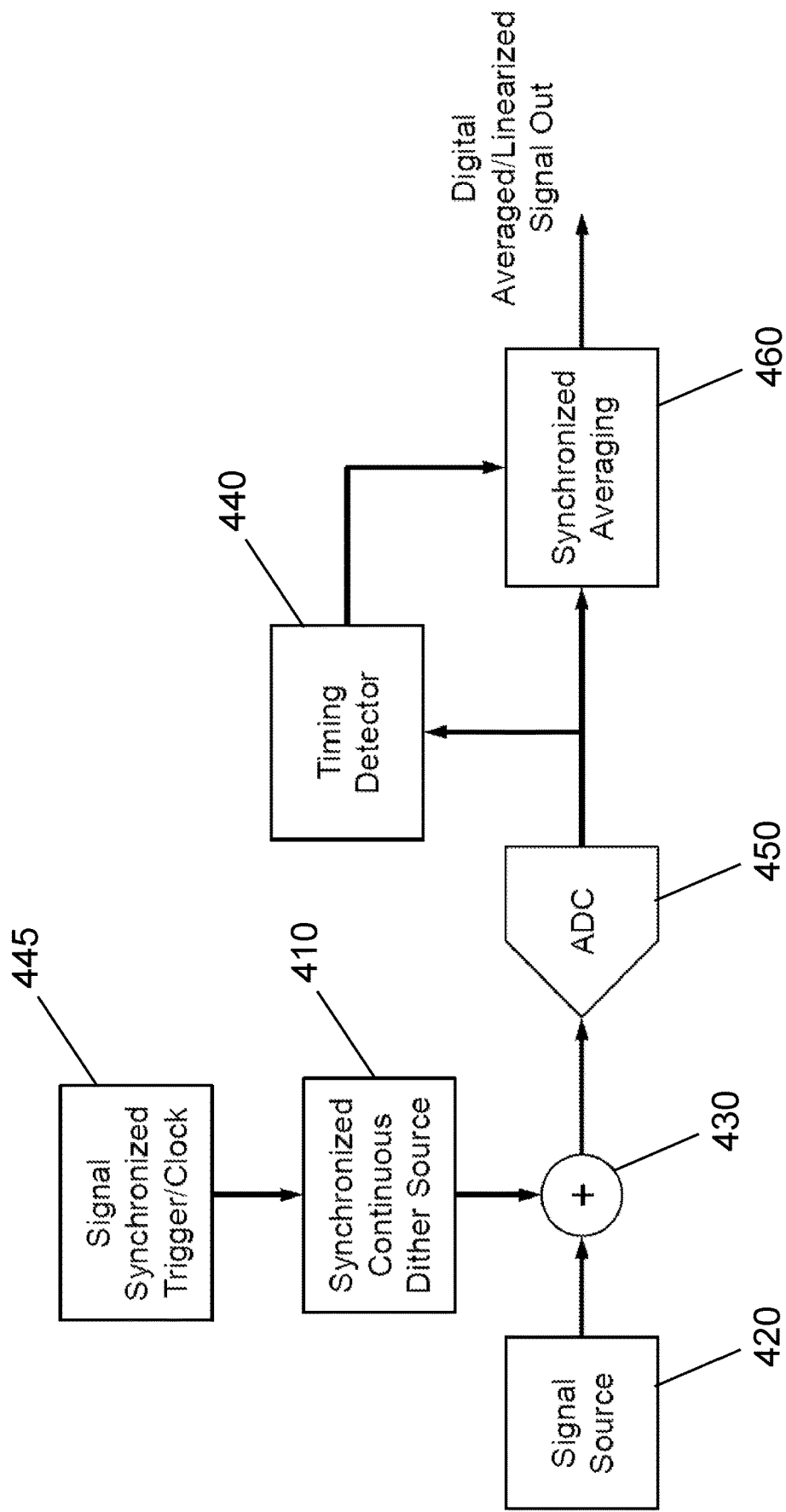
FIG. 4 is a block diagram illustrating yet another example system, which includes a signal synchronized trigger/clock, for the improved digitization of an analog repetitive signal.

In some embodiments, and as shown in FIG. 4, the system further includes a signal synchronized trigger/clock 445, whose output is fed into the synchronized continuous dither source 410. In this example, the continuous dither source may be synchronized using a clock from the signal synchronized trigger/clock 445, and the timing detector 440 controls the alignment of the waveforms in the digital signal output from the ADC 450.

Figure 5:
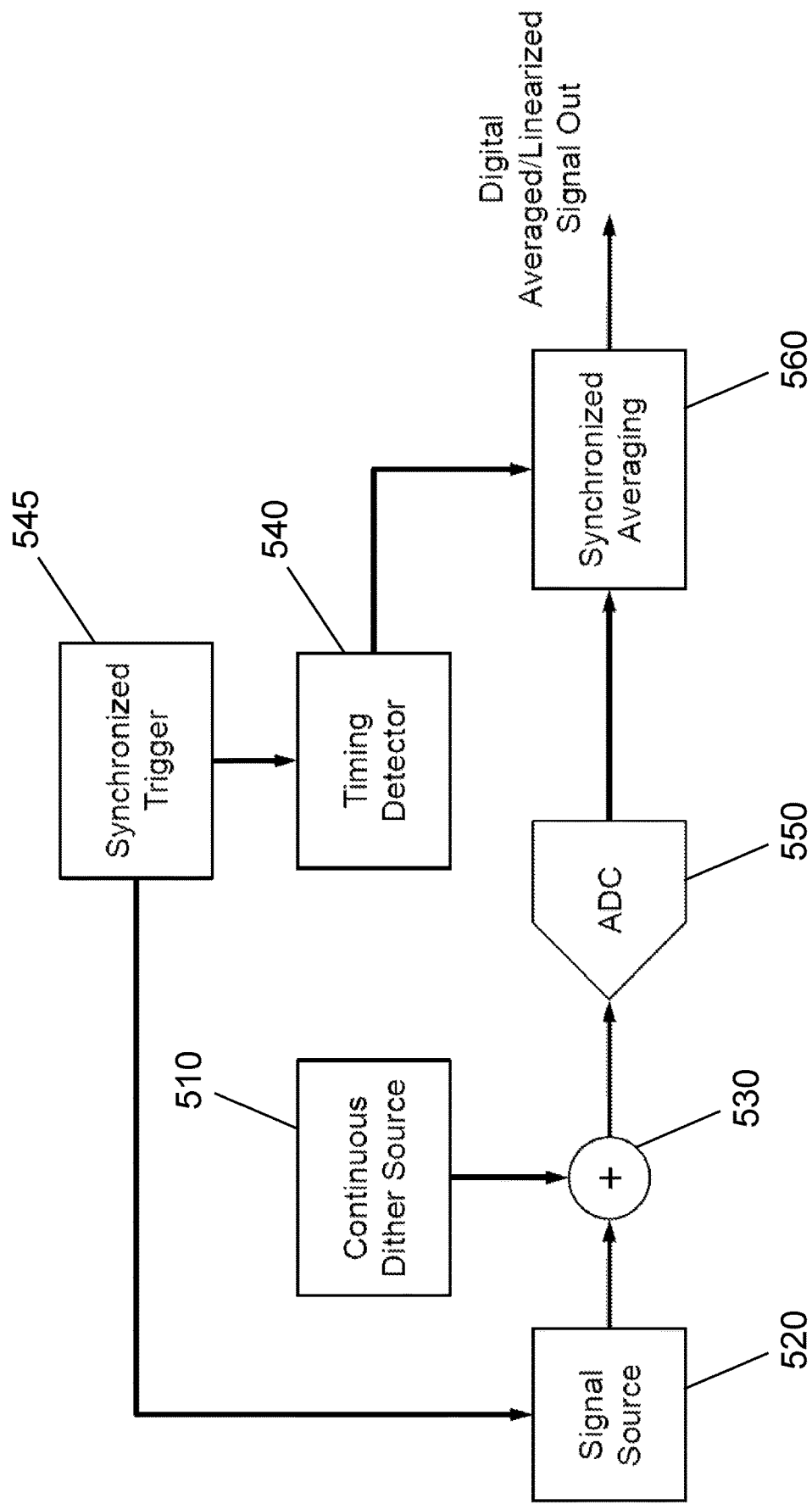
FIG. 5 is a block diagram illustrating yet another example system, which includes a synchronized trigger, for the improved digitization of an analog repetitive signal.

In some embodiments, and as shown in FIG. 5, the system further includes a synchronized trigger 545, which acts as a source for a trigger signal that is synchronized with the repeating waveform, and the output of the synchronized trigger 545 is input only to the timing detector 540.

Alternatively, the timing detector can be triggered off the signal under test itself, either with an analog split of the signal, or on the digitally measured signal directly. It can be advantageous to use an external trigger signal, if such a signal is available, even though it adds complexity. Triggering off an external trigger signal avoids added timing uncertainty due to noise on the signal. It also avoids the requirement for tailoring the threshold level depending on the signal. Adding a dither can also complicate the situation when triggering off the signal under test, since each waveform will be offset in amplitude and will trigger the timing detector at different times in the waveform. In this case, the dither value can be fed to the timing detector to offset the threshold level by the dither amount, though this adds more complexity to the system.

In some embodiments, the dither is a continuously varying analog waveform (e.g., generated by a digital-to-analog converter or an analog signal generator), which is designed such that the residual after waveform averaging at the signal repetition rate is zero or negligibly small. It is important that the residual be zero or small so as to avoid adding distortion to the waveform averaged result; the purpose of adding the dither is to reduce correlated distortions, so any distortion from the residual will negate the benefits of adding the dither.

In an example, an expression for the residual dither can be determined using the mathematical model of waveform averaging. Applying a time-varying dither to the signal under test modifies the waveform averaging expression of Eq. (1) to produce (denoted as Eq. (2)):

$$\bar{s}_{d,N}(t) \equiv \frac{1}{N}\sum_{n=0}^{N-1}[s(t+nT_s) + \mathcal{N}_s(t+nT_s) + d(t+nT_s)] = \bar{s}_N(t) + \bar{d}_N(t).$$

Herein, $\bar{s}_N(t)$ is as defined in Eq. (1) and the residual dither $\bar{d}_N(t)$ is defined as (denoted Eq. (3)):

$$\bar{d}_N(t) \equiv \frac{1}{N}\sum_{n=0}^{N-1}d(t+nT_s).$$

The residual dither acts as a distortion on the waveform averaged signal, with $(\bar{s}_N(t))=s(t)+\bar{d}_N(t)$. Here, the noise present on the dither is ignored, i.e., the noise on the dither can be considered negligible or the noise on the dither can be combined with that on the signal into the noise term $\mathcal{N}_s(t)$.

The residual dither defined in Eq. (3), i.e., d(t), can be decomposed into its Fourier series components (denoted Eq. (4)):

$$d(t) = \frac{A_0}{2} + \sum_{m=1}^{M}A_m\cos\left(\frac{2\pi}{NT_s}mt - \varphi_m\right).$$

Herein, $A_m$ and $\varphi_m$ are the amplitude and phase, respectively, of the $m^{th}$ Fourier component, and M is the largest Fourier component present in the dither signal, which can be arbitrarily large, though in practice it is limited by the bandwidth of the system. The DC term $A_0/2$ include a factor of ½ and has been excluded from the sum as is convention. It is noted that the portion of the dither included in the waveform averaging spans N signal waveforms to represent the period of the Fourier series expansion as $NT_s$. If all the non-zero Fourier components share a common factor, then the dither period would be a sub-multiple of $NT_s$ (i.e., $NT_s$ divided by the common factor). However, even in this case Eq. (4) and all subsequent equations are still valid.

The residual dither can be further analyzed by substituting Eq. (4) into Eq. (3), which yields (denoted as Eq. (5)):

$$\bar{d}_N(t) = \frac{A_0}{2} + \text{Re}\left\{\sum_{m=1}^{M}A_m\exp\left(i\frac{2\pi}{NT_s}mt - i\varphi_m\right)\frac{1}{N}\sum_{n=0}^{N-1}\exp\left(i\frac{2\pi}{N}mn\right)\right\}.$$

Herein, the Fourier series expansion has been expressed as the real part of a summation of complex exponentials for ease of calculation. Eq. (5) has been rearranged in such a way as to isolate the summation over n on the right side. Conveniently, this summation equals one if m is an integer multiple of N and is 0 otherwise (denoted as Eq. (6)):

$$\frac{1}{N}\sum_{n=0}^{N-1}\exp\left(i\frac{2\pi}{N}mn\right) = \begin{cases} 1 & \text{if } m = kN \\ 0 & \text{otherwise} \end{cases}.$$

Herein, k is a positive integer. Using Eq. (6), the expression for the residual dither greatly simplifies as (denoted Eq. (7)):

$$\bar{d}_N(t) = \frac{A_0}{2} + \sum_{k=1}^{M/N}A_{kN}\cos\left(\frac{2\pi}{T_s}kt - \varphi_{kN}\right).$$

Eq. (7) indicates that the only contributions to the residual dither are from the Fourier components at the harmonics of the signal repetition rate (including the $0^{th}$ order term $A_0/2$). From the result of Eq. (7), it follows that a periodic dither signal with period $NT_s$ (and hence synchronized with the analog repetitive signal), containing no Fourier components at harmonics of the signal repetition rate, will lead to zero residual dither upon waveform averaging. This important criterion is summarized as (denoted Eq. (8)):

$$A_{kN} = 0 \text{ for } 0 \le k \le \frac{M}{N}.$$

The above criterion relies on a periodic dither signal synchronized with the repetition rate of the signal. This synchronization can be achieved using a trigger or clock synchronized with the signal to lock the frequency of the dither source to the frequency of the signal source. One important note is that the criterion for residual dither, Eq. (8), does not depend on the phase of the dither Fourier components, nor the relative phase of the dither and the signal. This greatly simplifies the system as any relative delays in the system between the dither and signal are irrelevant.

Figure 6A:
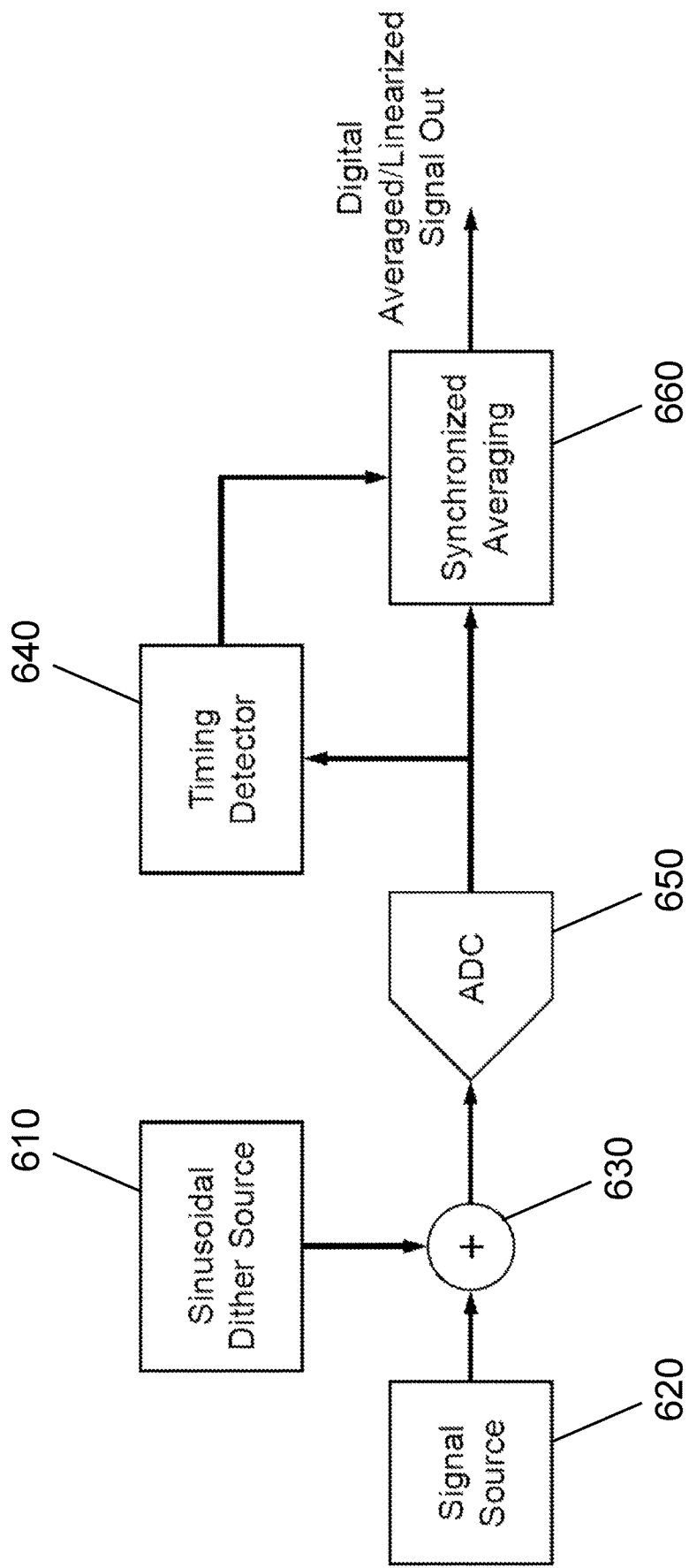
FIG. 6A is a block diagram illustrating yet another example system, which includes a sinusoidal dither source, for the improved digitization of an analog repetitive signal.

Examples of zero residual dithers include sinusoidal waveforms (e.g., as illustrated in FIG. 6A) synchronized with the signal repetition rate, i.e., with frequency $f_d=m/NT_s$, but with $m \ne kN$, i.e., the dither frequency must not be at a harmonic of the signal repetition rate. In most useful cases, N is large (~$10^2$, $10^3$, or higher), so many possible values of smaller m are possible. FIG. 6B illustrates an example Fourier decomposition of the sinusoidal dither. As shown therein, the harmonics of the signal repetition rate are plotted as vertical dashed lines and the component of the dither is plotted as a solid vertical arrow with length equal to the dither amplitude. The criteria of the dither frequency not being equal to a harmonic of the repetition rate is illustrated with the vertical arrow not overlapping with one of the vertical dotted lines. The criteria of the period of the dither being equal to $NT_s$ is illustrated by the dither Fourier component lying exactly on a multiple of $f_s/N$.

Figure 7:
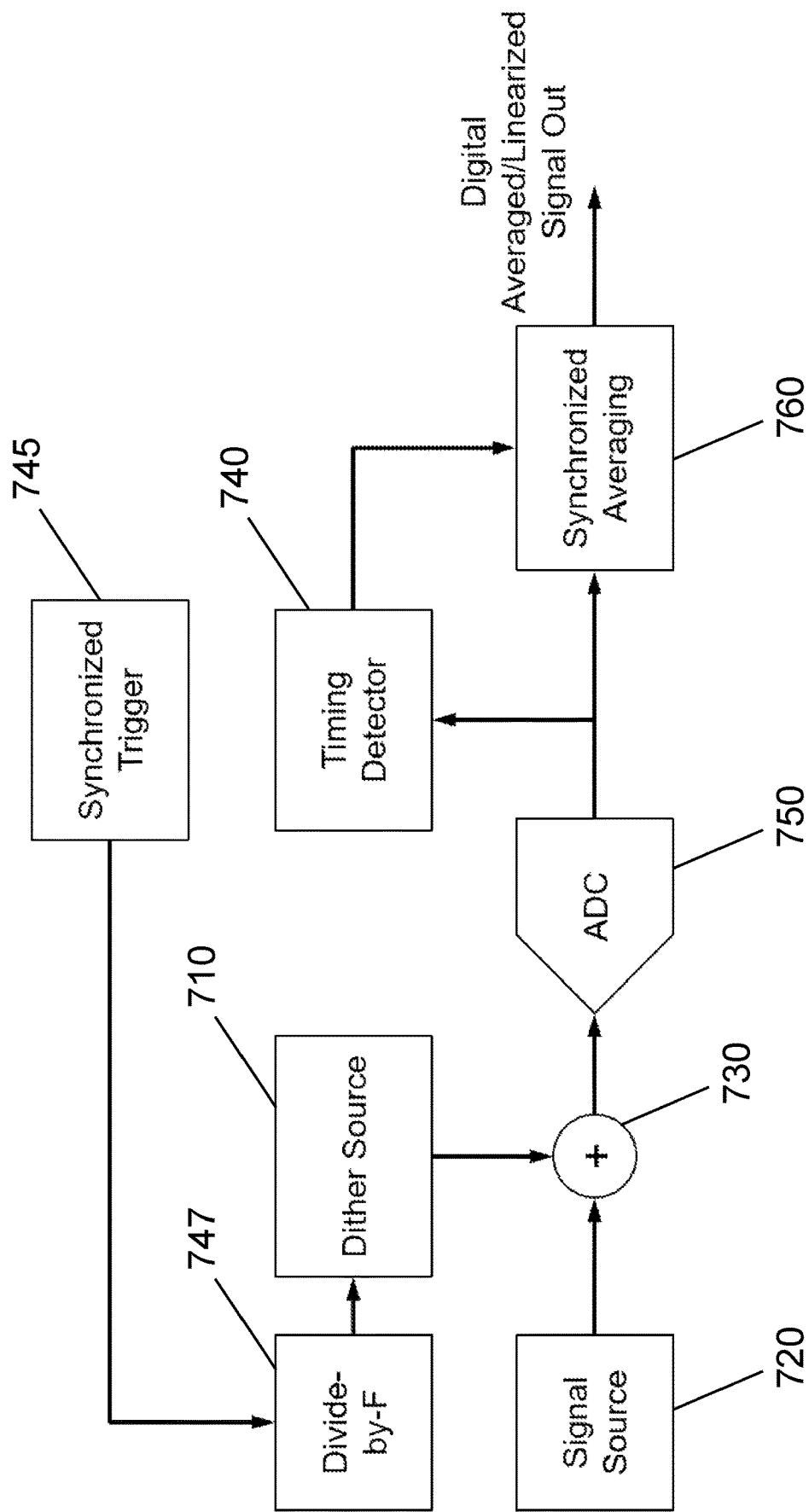
FIG. 7 is a block diagram illustrating yet another example system, which includes a sinusoidal source, for the improved digitization of an analog repetitive signal.

In some embodiments (e.g., as illustrated in FIG. 7), a clock divider circuit 647 can be used to divide the signal repetition rate by some factor F, a divisor of N, so that the frequency of the sinusoid is not a multiple of the signal repetition rate, thereby satisfying Eq. (8).

Figure 8A:
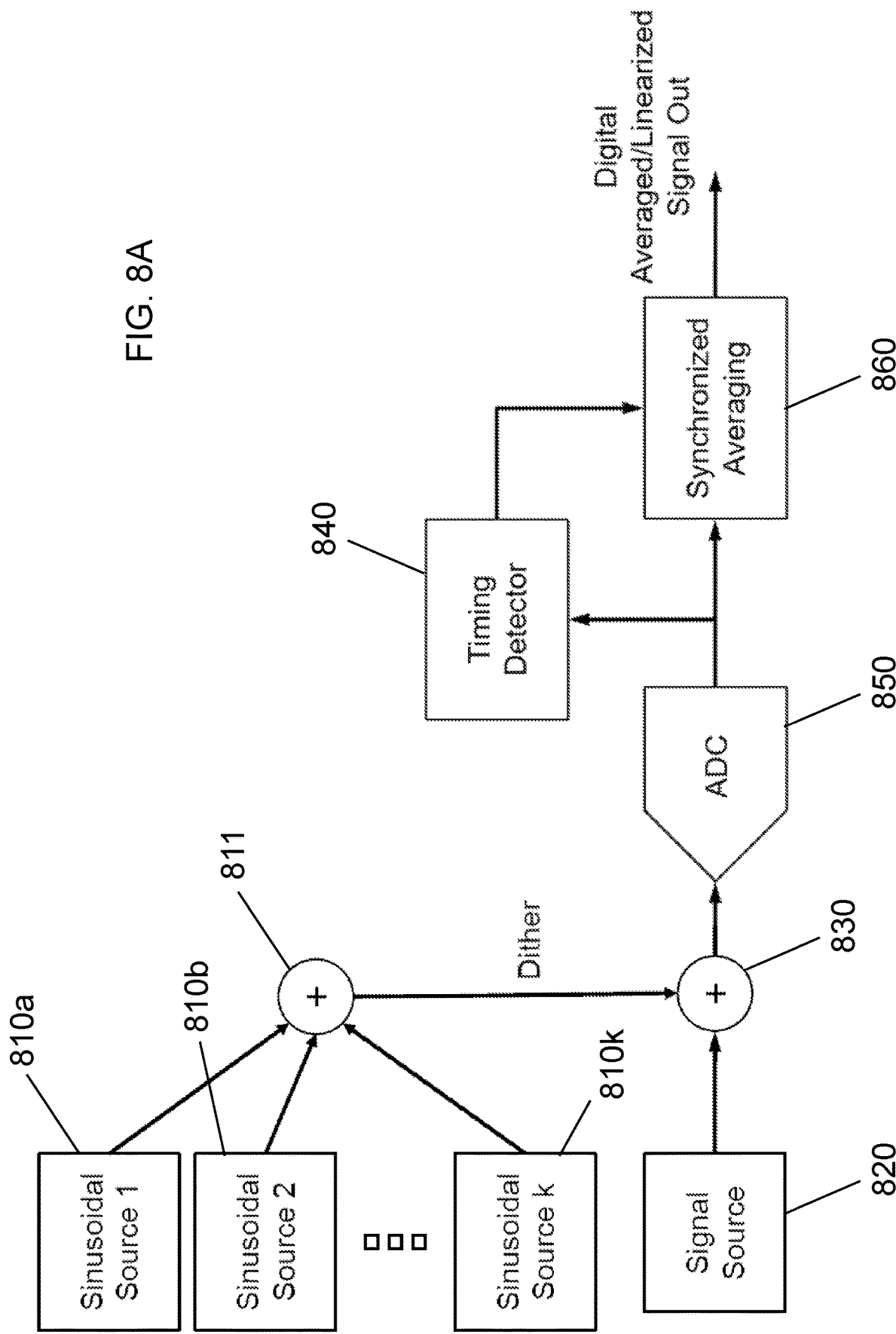
FIG. 8A is a block diagram illustrating yet another example system, which includes a dither source comprising multiple sinusoidal sources, for the improved digitization of an analog repetitive signal.
Figure 8B:
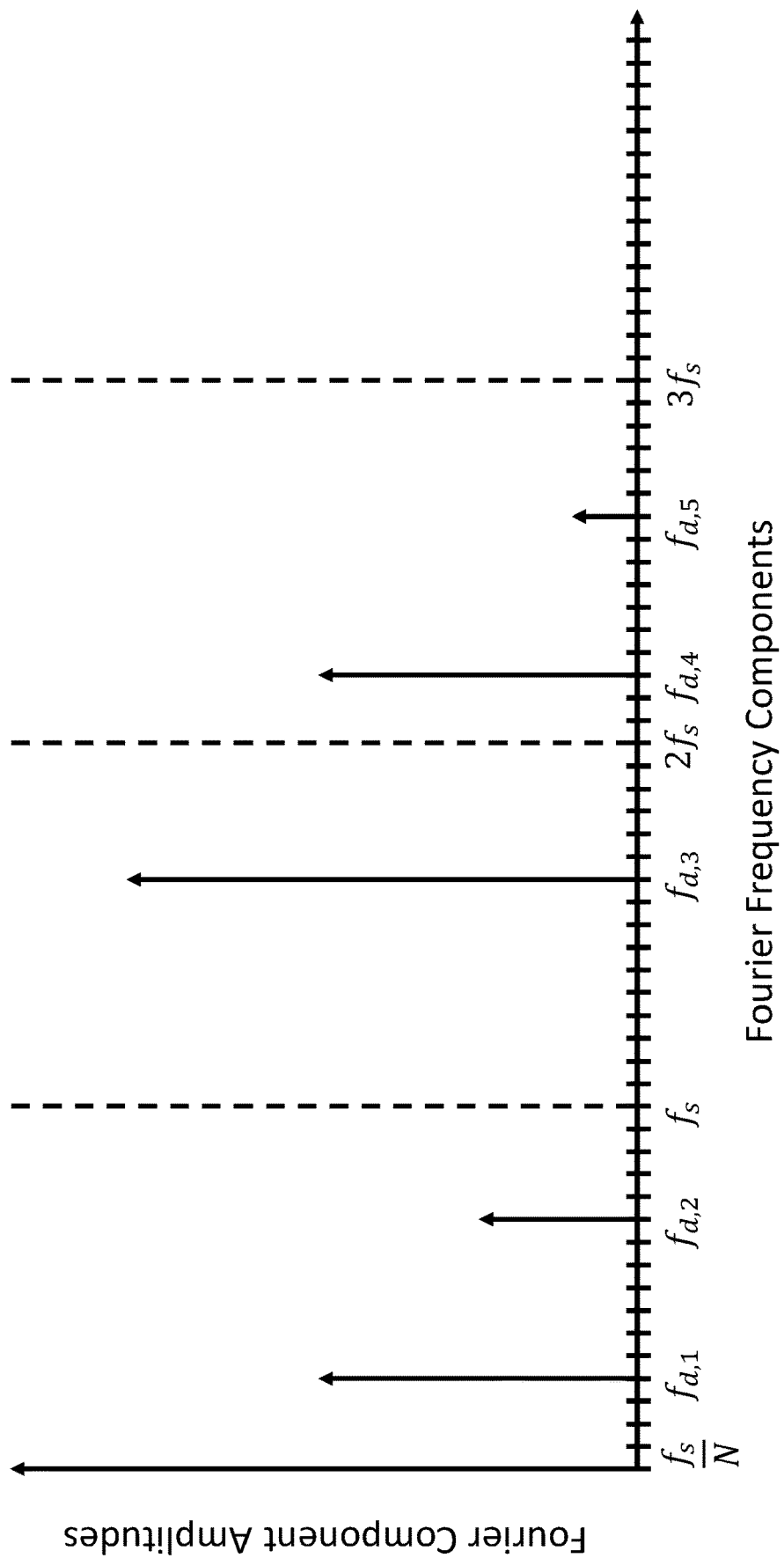
FIG. 8B illustrates an example Fourier decomposition of the multiple sinusoidal dithers.
Figure 9:
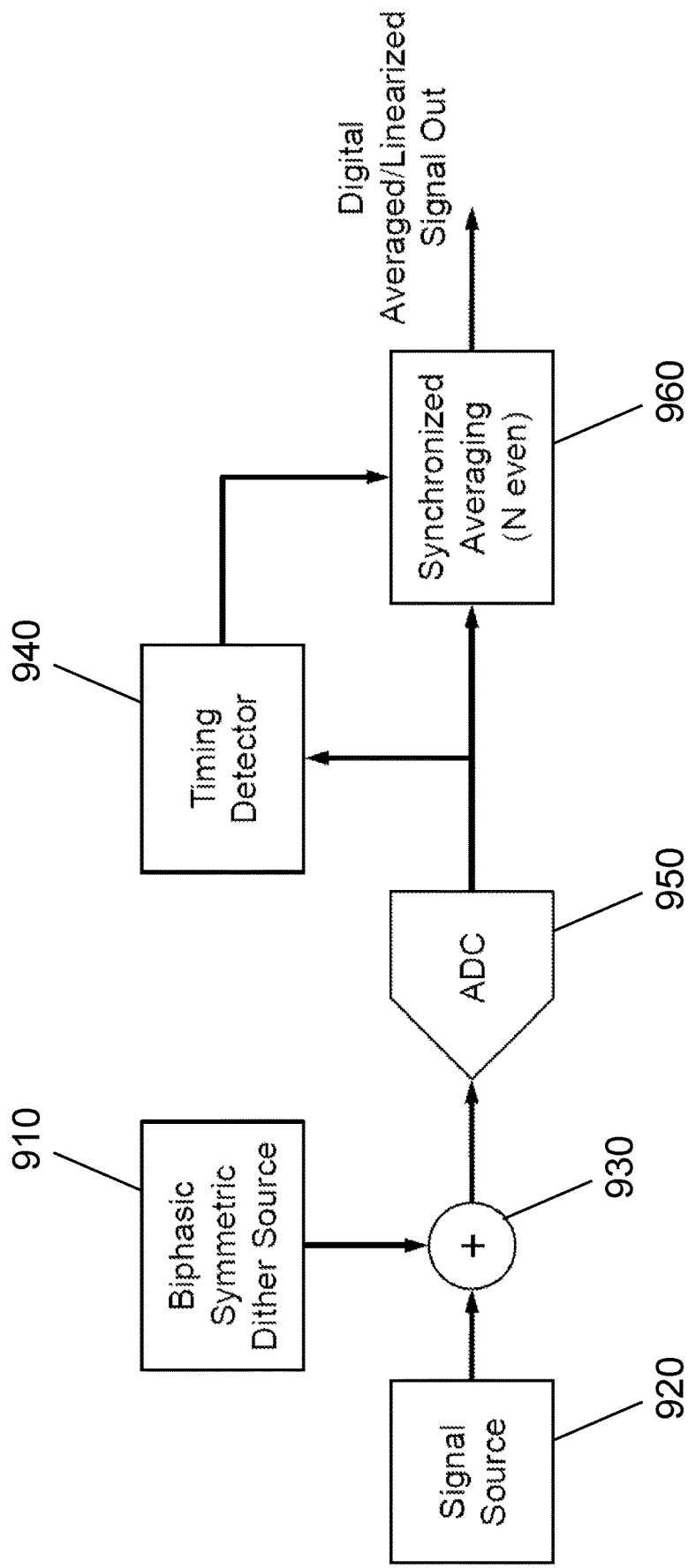
FIG. 9 is a block diagram illustrating yet another example system, which includes a biphasic symmetric dither source, for the improved digitization of an analog repetitive signal.

In some embodiments, and even more generally (e.g., as illustrated in FIG. 8A), a summation of sinusoids, each with a frequency not at a multiple of the signal repetition rate, with arbitrary relative phases and amplitudes, will result in zero residual dither. FIG. 8B illustrates an example Fourier decomposition of the multiple sinusoidal dithers. As shown therein, each of the five separate sinusoids have different amplitudes to illustrate that with respect to achieving zero residual dither after waveform averaging, the amplitudes of the individual sinusoids are irrelevant; it is only required that none of the sinusoids have a frequency equal to a harmonic of the repetition rate.

In some embodiments, and similar to combining such sinusoids, many more complex zero residual dither signals can be designed.

In some examples, if N is an even number, a summation of sinusoids with only odd components will always result in a zero residual dither. Such waveforms with only odd Fourier order components are termed biphasic symmetric, since $$d\left(t + \frac{NT_s}{2}\right) = -d(t)$$

One example of such a biphasic symmetric waveform (e.g., illustrated in FIG. 9) is a triangle waveform, with Fourier amplitudes $A_m \propto 1/m^2$ for odd m, and $A_m = 0$ for even m. A triangle waveform is particularly useful since it results in evenly distributed dither offsets.

In the embodiments described above, the one restriction that has been maintained is that the dither signal should have a period of $NT_s$, thereby requiring synchronization of the dither signal generator and the signal under test. This requirement can be relaxed, i.e., the frequency of the dither need not be at a harmonic of the signal repetition rate, and Eq. (8) need not be strictly satisfied.

This implementation greatly simplifies the system because the dither source no longer needs to be synchronized with the signal repetition rate. Furthermore, if the dither signal period is close to an integer multiple of the signal waveform period (e.g., $NT_s$, where N is the number of total signal waveforms averaged) and if the waveform period is much larger than signal waveform period, spectral leakage can be minimized and residual dither can be kept small.

Figure 10:
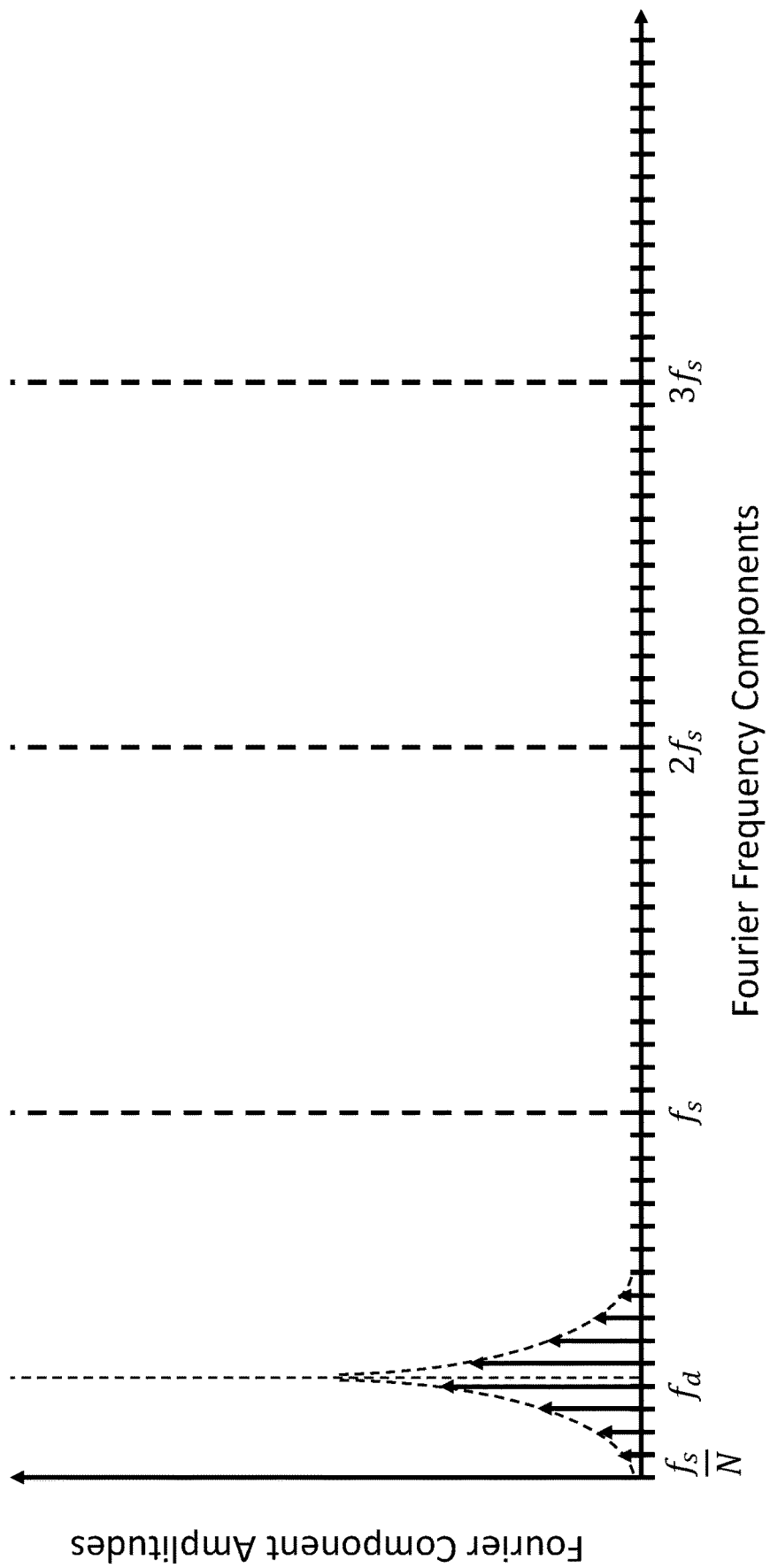
FIG. 10 illustrates an example Fourier decomposition of an asynchronous sinusoidal dither.

An example of the spectral leakage that occurs when the frequency of the dither is not exactly at a harmonic of the signal repetition rate is illustrated in FIG. 10. As shown therein, $f_d$ (the frequency of the dither signal) does not lie on a multiple of $f_s/N$, and spectral leakage occurs whereby Fourier components of the dither span multiple frequency bins outside the single dither frequency. However, as discussed above, if the dither frequency is close enough to an integer multiple of $f_s/N$ and if the dither frequency is small compared to or very different than the signal repetition rate, the spectral leakage into the harmonics of the signal repetition rate can be kept small, therefore minimizing the residual dither after waveform averaging.

In an example, a sinusoidal dither signal (denoted Eq. (9)) is considered:

$$d(t) = A_d \cos\left(\frac{2\pi}{NT_s}m(1+\delta)t\right).$$

Herein, m is an integer and $\delta \ll 1$ represents the amount by which the dither is asynchronous with the signal under test. The dither frequency in this case is given by (denoted Eq. (10)):

$$f_d = \frac{m(1+\delta)}{NT_s} \approx \frac{m}{NT_s}.$$

An example implementation of this scenario would be to use as a dither source an asynchronous sinusoidal generator with frequency nominally tuned to m/N times the signal repetition rate. As long as the frequency reference for the signal source and the sinusoidal generator are sufficiently stable, then the two sources can be run asynchronously, greatly simplifying the system. With the assumption m<<N, or equivalently, $f_d \ll f_s$, the amplitude of the Fourier components at the harmonics of the signal repetition rate are given by (denoted Eq. (10)):

$$A_{kN} \approx \begin{cases} A_d \delta & \text{for } k = 0 \\ \frac{2A_d\delta}{k^2}\left(\frac{f_d}{f_s}\right)\sqrt{\left(\frac{f_d}{f_s}\right)^2 + \pi^2 m^2 \delta^2 k^2} & \text{for } k > 0 \end{cases}.$$

Using Eq. (7), an estimate of the size of the residual dither may be determined from these harmonic amplitudes. The non-DC terms (k>0) are proportional to $\delta(f_d/f_s)^2$ or $\delta^2(f_d/f_s)$ or a combination thereof, depending on the relative scales of $\delta$ and $(f_d/f_s)$. As an example, if the dither frequency is a factor of 10 less than, and 1% asynchronous to, the signal repetition rate, the harmonic amplitudes are on the order of $10^{-4}$ times the amplitude of the dither signal. In such a case, the residual dither amplitude will be negligible. The DC term on the other hand scales linearly with $\delta$, such that in the previous example, there would be a residual DC offset of 1% left in the amplitude of the dither. This DC residual, though still small, may no longer be deemed negligible. However, in most waveform averaging applications, a residual DC offset is more tolerable than a time dependent residual, and this example configuration with an asynchronous dither would still work well.

Figure 11A:
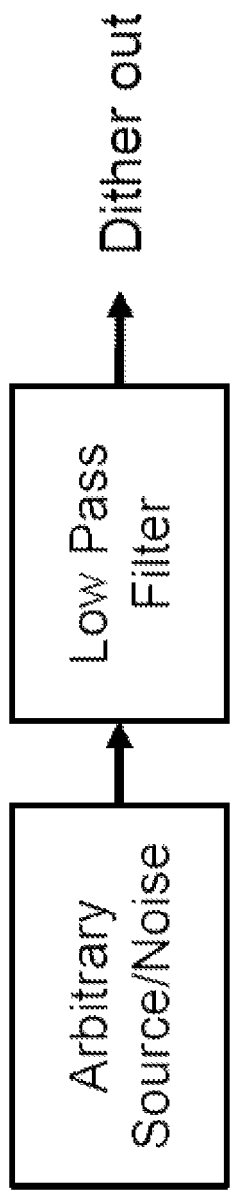
FIGS. 11A and 11B are block diagrams illustrating systems for generating a continuous dither source using low pass filtering without and with a DC block, respectively.

In some embodiments, non-periodic dithers can also be used to achieve a small residual dither, as long as the power of the dither at the harmonics of the signal repetition rate are negligibly small or zero. One way to achieve this is to apply a low pass filter with high rejection starting at the signal repetition rate to an arbitrary dither, as illustrated in FIG. 11A.

Figure 11B:
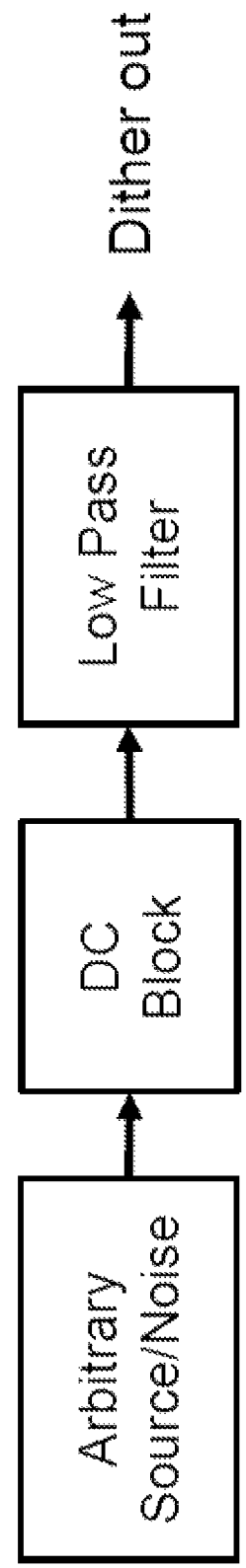
Figure 11C:
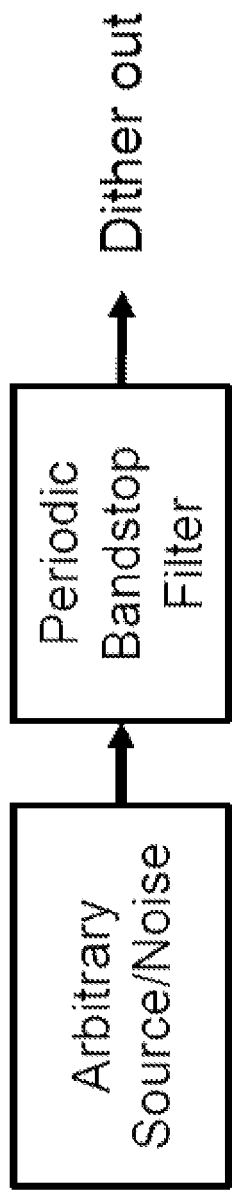
FIG. 11C and FIG. 11D are block diagrams illustrating systems for generating a continuous dither source using periodic bandpass filtering without and with a DC block, respectively.
Figure 11D:
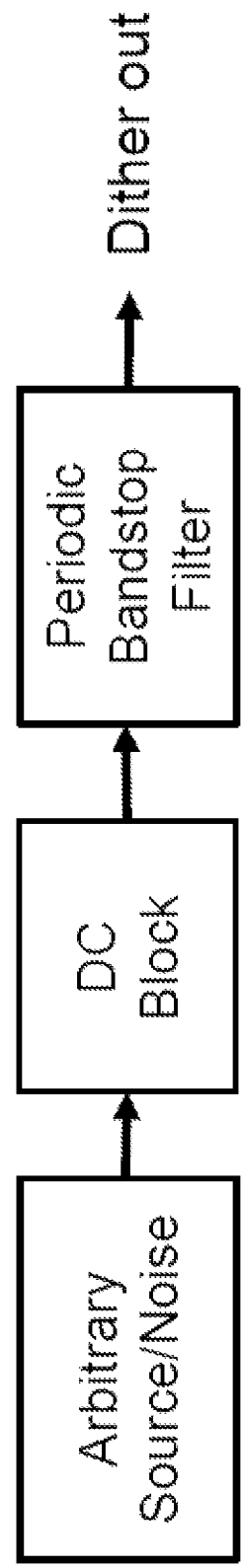
Figure 11E:
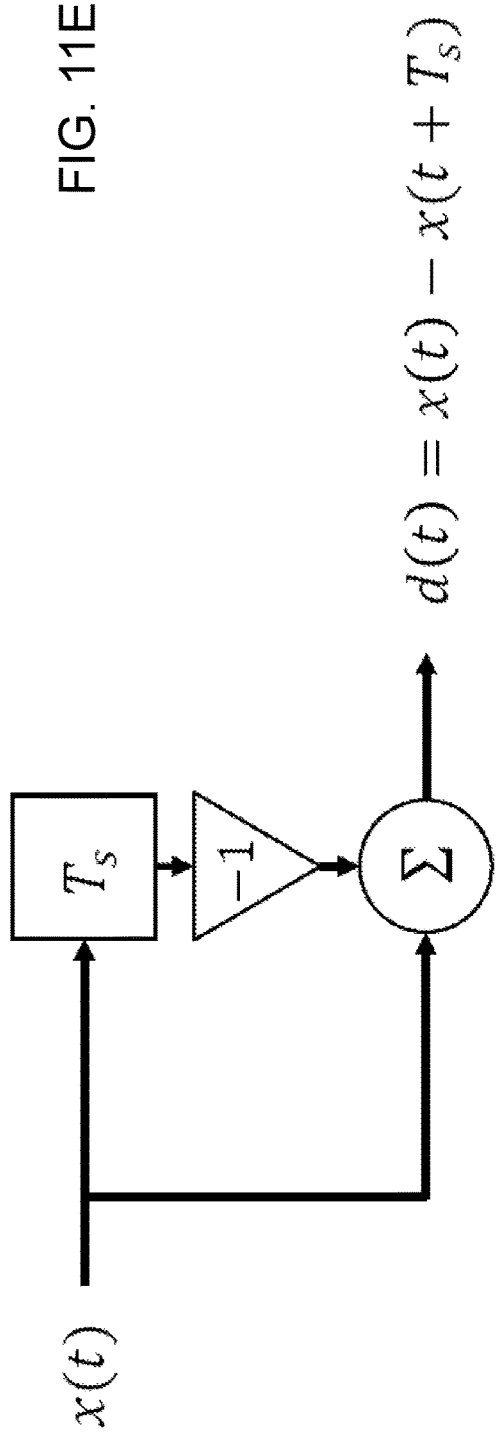
FIGS. 11E and 11F are block diagrams of example implementations of a one-tap FIR periodic bandstop filter.
Figure 11F:
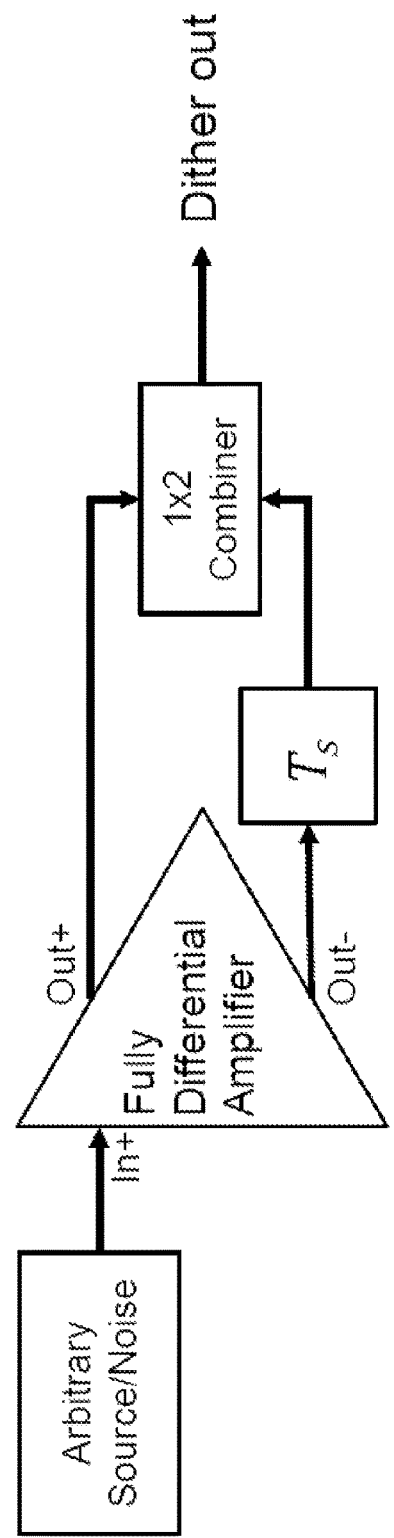

In some embodiments, if higher order Fourier components are desired, a periodic filter extinguishing power at each harmonic of the signal frequency can be used (e.g., as illustrated in FIG. 11C). An example of such a periodic filter would be a one-tap analog filter, as illustrated in FIG. 11E, that subtracts from the dither signal a copy of itself shifted by one signal waveform period. Another example, which uses a fully differential amplifier to implement the one-tap filter, is illustrated in FIG. 11F.

The amplitude of the residual after waveform averaging from such non-periodic dithers in this way will reduce with increasing N and can therefore be kept as small as required. To avoid excessive DC residual, a DC block can also be added (e.g., as illustrated in FIGS. 11B and 11D). Removing both the requirement of synchronization of the dither to the signal as well as periodicity of the dither further simplifies the system.

In the embodiments described above, the practicality that has been ignored is that the ADC sample rate, $f_{ADC}$, may not be synchronous with the signal waveform. In such a case, the residual dither expression of Eq. (3) is changed to (denoted Eq. (11)):

$$\bar{d}_N(t) = \frac{1}{N} \sum_{n=0}^{N-1} d(t + nT_s + \Delta t_n).$$

Herein, $\Delta t_n$ is the error associated with the ADC sample point not landing precisely at $(t+nT_s)$. However, if the ADC sample rate is much larger than the dither frequency, the requirement that the sampling rate of the ADC be synchronized with the signal and dither can be relaxed, while keeping the residual accrued due to these ADC sample errors small. To show this, the ADC sample errors can be modeled as uncorrelated, uniformly distributed random variable with width equal to the ADC sample period, $1/f_{ADC}$. With such a model, the standard deviation of the residual from a sinusoidal dither of frequency $f_d = m/NT_s$ and amplitude $A_d$, is calculated to be (denoted Eq. (12)):

$$\sigma_{d_N} = \frac{\pi A_d}{\sqrt{6N}} \left( \frac{f_d}{f_{ADC}} \right).$$

As seen in Eq. (12), the standard deviation scales as the ratio of the dither frequency to ADC sample rate over the square root of the number of averaged signal waveforms. This ratio in practice can typically be chosen very small. For example, the ADC sample rate typically exceeds the Nyquist of the signal which can be many times the repetition rate of the waveform (e.g., $f_{ADC} = 100 f_s$). Additionally, the dither frequency can be chosen much smaller than the repetition rate of the signal (e.g., $f_s = 100 f_d$). Finally, N is also typically large in order to sufficiently reduce the noise of the signal (e.g., N>100). In a configuration with these example parameters, the residual dither will be $<10^{-5}$ the amplitude of the dither signal, clearly negligible.

Figure 12:
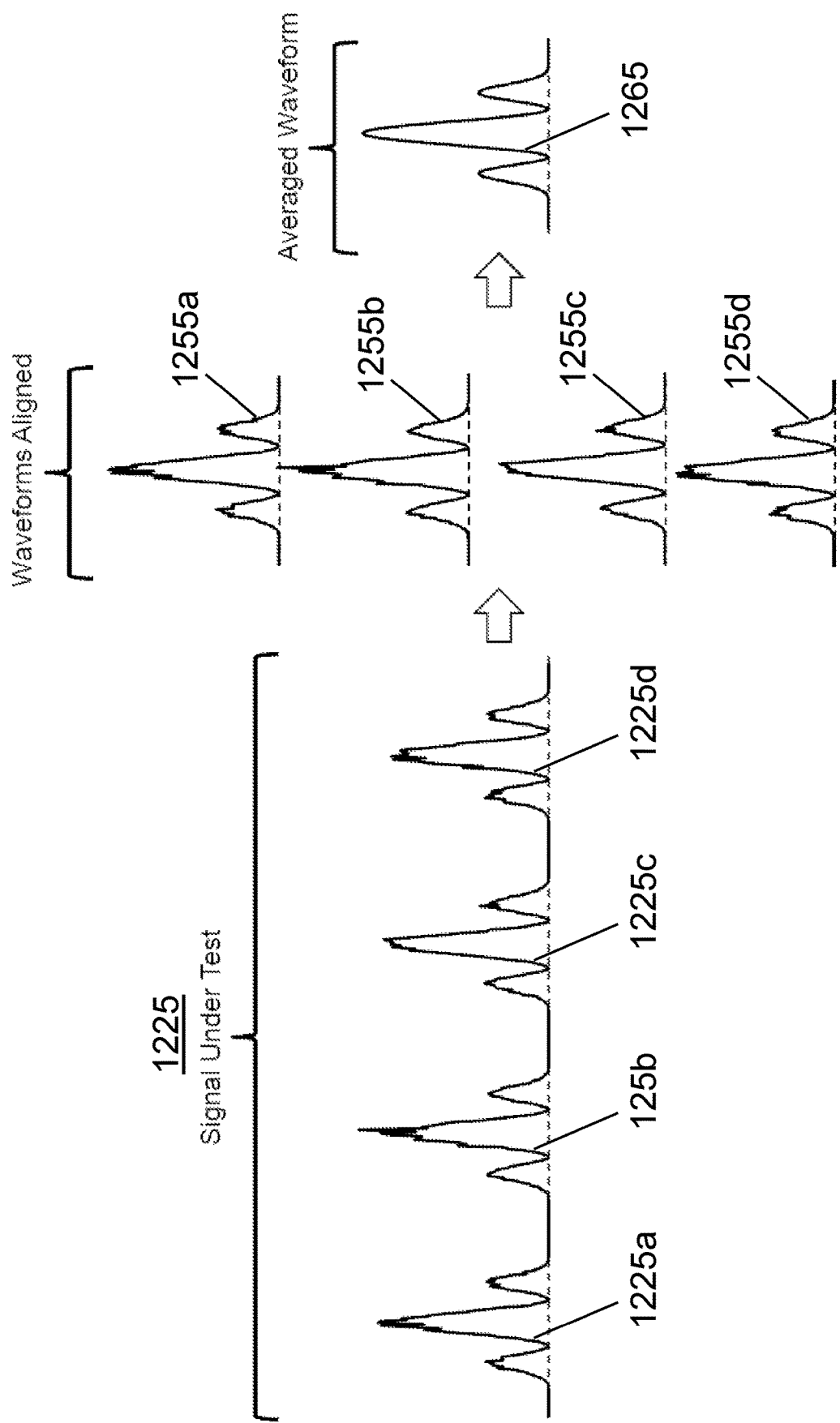
FIG. 12 illustrates an example of waveform averaging technique.

FIG. 12 illustrates an example of waveform averaging without using a continuous time-varying dither source. As shown therein, the signal under test 1225 includes multiple repeated waveforms (denoted 1225a, 1225b, 1225c, 1225d) with no analog time-varying dither offsets applied. Each of the multiple repeated waveforms are aligned (denoted 1255a, 1255b, 1255c, 1255d) and then used to generate the averaged waveform 1265. As discussed previously, the conventional waveform averaging process shown in FIG. 12 can mitigate uncorrelated errors but cannot compensate for correlated noise and distortion.

Figure 13:
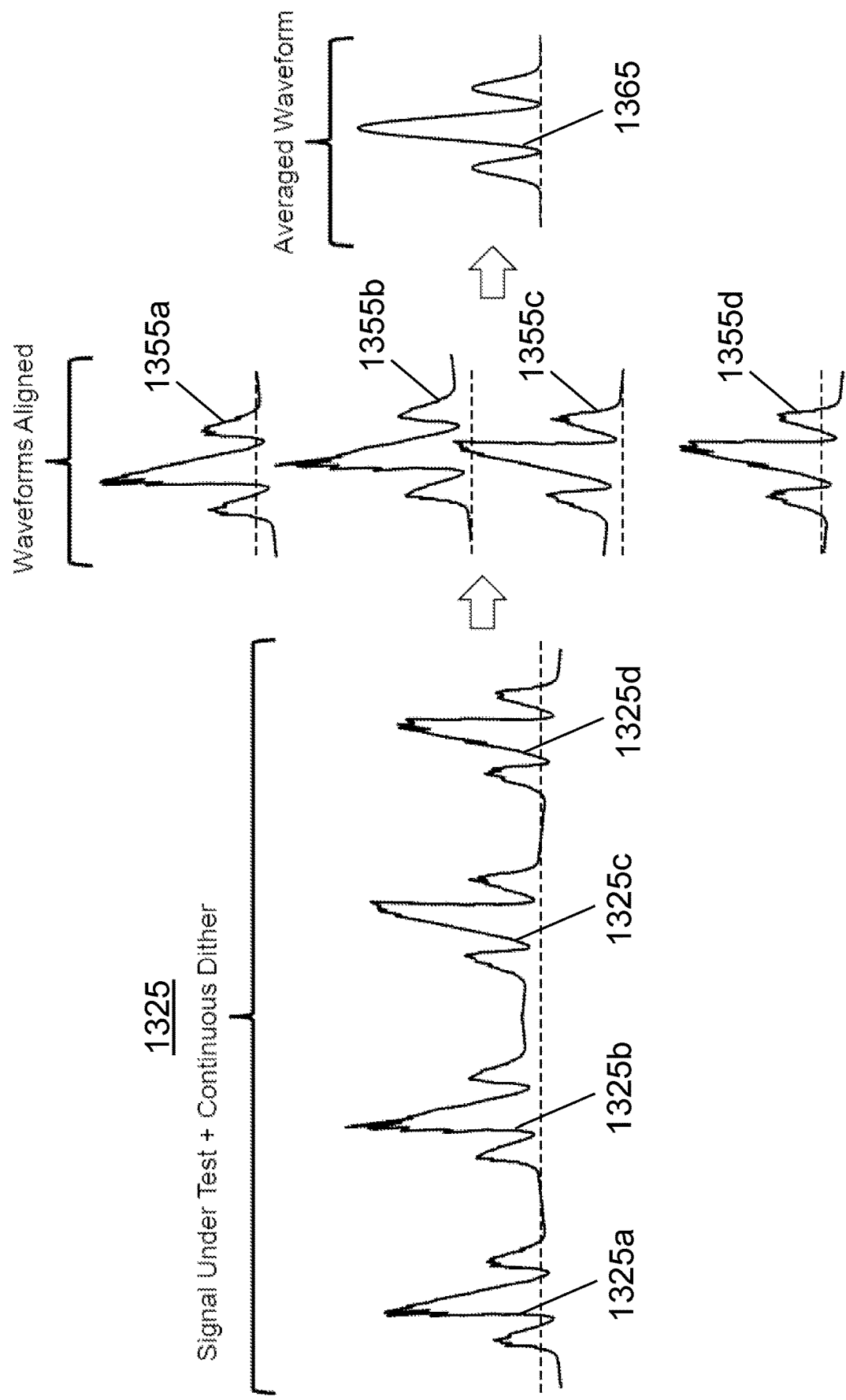
FIG. 13 illustrates an example of waveform averaging technique using a continuous time-varying dither signal, which improves the digitization of an analog repetitive signal.

FIG. 13 illustrates an example of waveform averaging using a continuous time-varying dither signal, which improves the digitization of an analog repetitive signal. As shown therein, the time-varying dither signal is combined with the signal under test (denoted 1325) and includes multiple repeated waveforms (denoted 1325a, 1325b, 1325c, 1325d), each of which is offset from DC in a time-varying manner. Each of the multiple repeated waveforms, with its corresponding offset dither signal, is aligned (denoted 1355a, 1355b, 1355c, 1355d) and used to generate the averaged waveform 1365. As discussed above, using the continuous time-varying dither signal advantageously enables correlated noise and distortions to be mitigated, amongst other benefits, which results in a high fidelity characterization of the repeated waveform.

The disclosed embodiments use a continuous dither source (instead of a discrete offset dither source) which can achieve faster convergence, or equivalently, need fewer instances of the waveform to average over to reach a predetermined fidelity, because there is no settling time in the continuous time-varying dither signal. Additionally, not needing to match the relative phases of the analog repetitive signal and the continuous time-varying dither signal can result in lower complexity requirements. For example, as long as the sum over the N waveforms is zero, then the phases are irrelevant to the analysis and performance of the embodiments.

Figure 14:
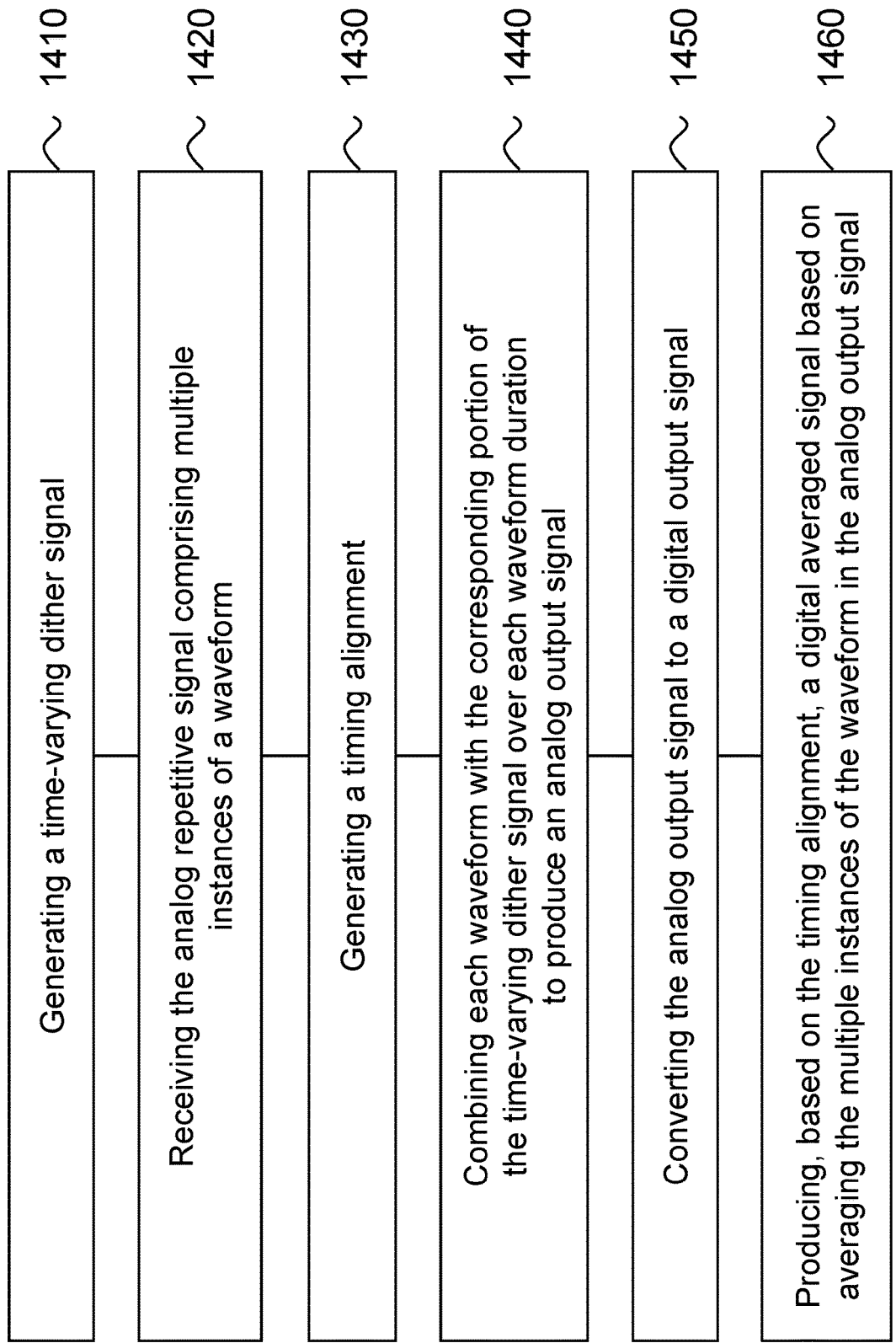
FIG. 14 is a flowchart of an example method for improving digitization of an analog repetitive signal.

FIG. 14 is a flowchart of an example method for improving digitization of an analog repetitive signal. The method 1400 includes, at operation 1410, generating a time-varying dither signal.

The method 1400 includes, at operation 1420, receiving the analog repetitive signal comprising multiple instances of a waveform. In some embodiments, each waveform has a waveform duration, an average of the time-varying dither signal over multiple waveform durations is substantially zero, and the time-varying dither signal varies over each waveform duration. The average of the time-varying dither signal over multiple waveform durations being substantially zero accounts for residual noise, settling error, drift, and other implementation artifacts.

The method 1400 includes, at operation 1430, generating a timing alignment.

The method 1400 includes, at operation 1440, combining each waveform with the corresponding portion of the time-varying dither signal over each waveform duration to produce an analog output signal.

The method 1400 includes, at operation 1450, converting the analog output signal to a digital output signal.

The method 1400 includes, at operation 1460, producing, based on the timing alignment, a digital averaged signal based on averaging the multiple instances of the waveform in the analog output signal.

In some embodiments, the timing alignment is used to align the multiple instances of the waveform in the analog output signal.

In some embodiments, the method 1400 further includes the operation of generating the analog repetitive signal.

In some embodiments, the method 1400 further includes the operation of generating a timing information comprising a start time of at least one waveform of the analog repetitive signal, wherein the timing alignment is based on the timing information, and using the timing alignment to align each waveform of the analog repetitive signal and the corresponding portion of the time-varying dither signal.

In some embodiments, averaging the multiple instances of the waveform uses a combination of fixed-point arithmetic and floating-point arithmetic.

In some embodiments, a period of the time-varying dither signal is substantially equal to a multiple of the waveform duration of the analog repetitive signal.

Embodiments of the disclosed technology include an apparatus for improving digitization of an analog repetitive signal includes a continuous dither source configured to generate a time-varying dither signal, an adder circuit, coupled to the continuous dither source, configured to receive the analog repetitive signal comprising multiple instances of a waveform, wherein each waveform has a waveform duration, receive the time-varying dither signal, wherein an average of the time-varying dither signal over multiple waveform durations is substantially zero, and wherein the time-varying dither signal varies over each waveform duration, and combine each waveform with a corresponding portion of the time-varying dither signal over each waveform duration, a timing detector configured to generate a timing alignment, an analog to digital converter (ADC), coupled to the adder circuit, configured to receive an analog output signal from the adder circuit and convert the analog output signal to a digital output signal, and a synchronized averaging circuit, coupled to the analog to digital converter and the timing detector, configured to receive the digital output signal and the timing alignment, and to produce a digital averaged signal.

In some embodiments, the apparatus further includes a signal source, coupled to the adder circuit, configured to generate the analog repetitive signal.

In some embodiments, the sample rate of the ADC is synchronized with the signal source. In some examples, the ADC sample rate is synchronized with the signal source by configuring the ADC to accept and align its sample rate to a signal synchronized clock.

In some embodiments, the timing detector is coupled to the continuous dither source and the timing alignment is associated with each of the multiple instances of a waveform of the analog repetitive signal and with the corresponding portion of the time-varying dither signal.

In some embodiments, the apparatus further includes a synchronized trigger circuit, coupled to the timing detector, configured to generate the timing alignment associated with each waveform of the analog repetitive signal and the corresponding portion of the time-varying dither signal.

In some embodiments, the continuous dither source comprises a sinusoidal dither source configured to generate the time-varying dither signal in a form of a sinusoidal signal (or sinusoidal voltage signal) that is synchronized with a repetition rate of the analog repetitive signal, and a frequency of the sinusoidal signal does not correspond to a multiple of the repetition rate.

In some embodiments, the multiple instances of the waveform comprise N instances of the waveform, the period is determined by dividing the repetition rate by a factor F using a clock divider, and F is a non-negative integer and N/F is an integer.

In some embodiments, the continuous dither source comprises a biphasic symmetric dither source configured to generate a biphasic symmetric dither signal, the multiple instances of the waveform comprise N instances of the waveform, and N is even.

In an example, the biphasic symmetric dither signal is a triangle signal.

In some embodiments, the continuous dither source comprises a plurality of sinusoidal sources, each of the plurality of sinusoidal sources is configured to generate a sinusoidal signal with an arbitrary phase and amplitude, a frequency of each of the sinusoidal signals is different from a harmonic of a repetition rate of the analog repetitive signal, and the time-varying dither signal is a sum of the sinusoidal signals.

In some embodiments, the time-varying dither signal is a low-pass filtered output of a noise source having a low-pass filter cut-off frequency that is less than a repetition rate of the analog repetitive signal.

In some embodiments, the time-varying dither signal is a periodic bandstop filtered output of a noise source having a periodic bandstop filter that is configured to filter out frequencies at one or more harmonics of a repetition rate of the analog repetitive signal.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

It is understood that at least some of the component of the disclosed embodiments may be implemented individually, or collectively, in devices comprised of a processor, a memory unit, an interface that are communicatively connected to each other. The processor and/or controller can perform various disclosed operations based on execution of program code that is stored on a storage medium. The processor and/or controller can, for example, be in communication with at least one memory and with at least one communication unit that enables the exchange of data and information, directly or indirectly, through the communication link with other entities, devices and networks. The communication unit may provide wired and/or wireless communication capabilities in accordance with one or more communication protocols, and therefore it may comprise the proper transmitter/receiver antennas, circuitry and ports, as well as the encoding/decoding capabilities that may be necessary for proper transmission and/or reception of data and other information.

Various information and data processing operations described herein may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media that is described in the present application comprises non-transitory storage media. Generally, program modules may include routines, programs, objects, components, data structures, etc. that perform particular tasks or implement particular abstract data types. Computer-execut-

What is claimed is:

1. An apparatus for improving digitization of an analog repetitive signal, comprising:
   a continuous dither source configured to generate a time-varying dither signal;
   an adder circuit, coupled to the continuous dither source, configured to:
   receive the analog repetitive signal comprising multiple instances of a waveform, wherein each waveform has a waveform duration,
   receive the time-varying dither signal, wherein an average of the time-varying dither signal over multiple waveform durations is substantially zero, and wherein the time-varying dither signal varies over each waveform duration, and
   combine each waveform with a corresponding portion of the time-varying dither signal over each waveform duration;
   a timing detector configured to generate a timing alignment;
   an analog to digital converter (ADC), coupled to the adder circuit, configured to receive an analog output signal from the adder circuit and convert the analog output signal to a digital output signal; and
   a synchronized averaging circuit, coupled to the analog to digital converter and the timing detector, configured to receive the digital output signal and the timing alignment, and to produce a digital averaged signal.

2. The apparatus of claim 1, further comprising:
   a signal source, coupled to the adder circuit, configured to generate the analog repetitive signal.

3. The apparatus of claim 1, wherein a sample rate of the ADC is synchronized with the signal source.

4. The apparatus of claim 1, wherein the timing detector is coupled to the continuous dither source and the timing alignment is associated with each of the multiple instances of a waveform of the analog repetitive signal and with the corresponding portion of the time-varying dither signal.

5. The apparatus of claim 4, further comprising:
   a synchronized trigger circuit, coupled to the timing detector, configured to generate the timing alignment associated with each waveform of the analog repetitive signal and the corresponding portion of the time-varying dither signal.

6. The apparatus of claim 4, wherein the continuous dither source comprises a sinusoidal dither source configured to generate the time-varying dither signal in a form of a sinusoidal signal that is synchronized with a repetition rate of the analog repetitive signal, and wherein a frequency of the sinusoidal signal does not correspond to a multiple of the repetition rate.

7. The apparatus of claim 6, wherein the multiple instances of the waveform comprise N instances of the waveform, wherein the period is determined by dividing the repetition rate by a factor F using a clock divider, and wherein F is a non-negative integer and N/F is an integer.

8. The apparatus of claim 4, wherein the continuous dither source comprises a biphasic symmetric dither source configured to generate a biphasic symmetric dither signal, wherein the multiple instances of the waveform comprise N instances of the waveform, and wherein N is even.

9. The apparatus of claim 8, wherein the biphasic symmetric dither signal is a triangle signal.

10. The apparatus of claim 1, wherein the continuous dither source comprises a plurality of sinusoidal sources, wherein each of the plurality of sinusoidal sources is configured to generate a sinusoidal signal with an arbitrary phase and amplitude, wherein a frequency of each of the sinusoidal signals is different from a harmonic of a repetition rate of the analog repetitive signal, and wherein the time-varying dither signal is a sum of the sinusoidal signals.

11. The apparatus of claim 1, wherein the time-varying dither signal is a low-pass filtered output of a noise source having a low-pass filter cut-off frequency that is less than a repetition rate of the analog repetitive signal.

12. The apparatus of claim 1, wherein the time-varying dither signal is a periodic bandstop filtered output of a noise source having a periodic bandstop filter that is configured to filter out frequencies at one or more harmonics of a repetition rate of the analog repetitive signal.

13. A method for improving digitization of an analog repetitive signal, comprising:
   generating a time-varying dither signal;
   receiving the analog repetitive signal comprising multiple instances of a waveform, wherein each waveform has a waveform duration, wherein an average of the time-varying dither signal over multiple waveform durations is substantially zero, and wherein the time-varying dither signal varies over each waveform duration;
   generating a timing alignment;
   combining each waveform with the corresponding portion of the time-varying dither signal over each waveform duration to produce an analog output signal;
   converting the analog output signal to a digital output signal; and
   producing, based on the timing alignment, a digital averaged signal based on averaging the multiple instances of the waveform in the analog output signal, wherein the timing alignment is used to align the multiple instances of the waveform in the analog output signal.

14. The method of claim 13, further comprising:
   generating the analog repetitive signal.

15. The method of claim 13, further comprising:
   generating a timing information comprising a start time of at least one waveform of the analog repetitive signal, wherein the timing alignment is based on the timing information; and
   using the timing alignment to align each waveform of the analog repetitive signal and the corresponding portion of the time-varying dither signal.

16. The method of claim 13, wherein averaging the multiple instances of the waveform uses a combination of fixed-point arithmetic and floating-point arithmetic.

17. The method of claim 13, wherein a period of the time-varying dither signal is substantially equal to a multiple of the waveform duration of the analog repetitive signal.

18. The method of claim 13, wherein the time-varying dither signal comprises a biphasic symmetric dither signal, wherein the multiple instances of the waveform comprise N instances of the waveform, and wherein N is even.

19. The method of claim 18, wherein the biphasic symmetric dither signal is a triangle signal.

20. An apparatus for improving digitization of an analog repetitive signal, comprising:
- means for generating a time-varying dither signal;
- means for summing two signals configured to:
  - receive the analog repetitive signal comprising multiple instances of a waveform, wherein each waveform has a waveform duration,
  - receive the time-varying dither signal, wherein an average of the time-varying dither signal over multiple waveform durations is substantially zero, and wherein the time-varying dither signal varies over each waveform duration, and
  - combine each waveform of the analog repetitive signal with a corresponding portion of the time-varying dither signal over the waveform duration;
- means for generating a timing alignment;
- means for converting an analog signal to a digital signal configured to receive an analog output signal from the means for summing and convert the analog output signal to a digital output signal; and
- means for averaging configured to receive the digital output signal and the timing alignment, and to produce a digital averaged signal.

* * * * *